(12) United States Patent
Tateishi et al.

(10) Patent No.: US 8,164,352 B2
(45) Date of Patent: Apr. 24, 2012

(54) CAPACITANCE DETECTING APPARATUS

(75) Inventors: Kiyoshi Tateishi, Tsurugashima (JP); Takanori Maeda, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 657 days.

(21) Appl. No.: 12/278,541

(22) PCT Filed: Jan. 23, 2007

(86) PCT No.: PCT/JP2007/050972
§ 371 (c)(1),
(2), (4) Date: Aug. 25, 2008

(87) PCT Pub. No.: WO2007/091419
PCT Pub. Date: Aug. 16, 2007

(65) Prior Publication Data
US 2009/0001998 A1    Jan. 1, 2009

(30) Foreign Application Priority Data
Feb. 7, 2006   (JP) .................. 2006-029917

(51) Int. Cl.
*G01R 27/26*   (2006.01)
(52) U.S. Cl. ...................................... 324/686
(58) Field of Classification Search ............... 324/661, 324/676–680, 686–690
See application file for complete search history.

(56) References Cited

U.S. PATENT DOCUMENTS

| | | | | |
|---|---|---|---|---|
| 3,546,595 A * | 12/1970 | Blakely, Jr. | ........ | 324/654 |
| 4,636,714 A * | 1/1987 | Allen | ........ | 324/678 |
| 5,602,486 A * | 2/1997 | Novak | ........ | 324/671 |
| 6,476,620 B2 * | 11/2002 | Kato et al. | ........ | 324/662 |
| 6,483,322 B2 * | 11/2002 | Aoyama et al. | ........ | 324/661 |
| 6,545,613 B1 * | 4/2003 | Hornback | ........ | 340/870.14 |
| 7,123,027 B2 * | 10/2006 | Tola et al. | ........ | 324/662 |
| 7,324,029 B2 * | 1/2008 | Wang | ........ | 341/143 |
| 2004/0027935 A1 * | 2/2004 | Cho et al. | ........ | 369/43 |
| 2006/0007181 A1 * | 1/2006 | Jung et al. | ........ | 345/173 |
| 2007/0069830 A1 * | 3/2007 | Kelkar et al. | ........ | 331/167 |

FOREIGN PATENT DOCUMENTS

| | | |
|---|---|---|
| JP | 06-160448 | 6/1994 |
| JP | 06-180336 | 6/1994 |
| JP | 8-122180 | 5/1996 |
| JP | 08122180 A * | 5/1996 |
| JP | 11-014482 | 1/1999 |
| JP | 3020736 | 1/2000 |
| JP | 3218448 | 8/2001 |
| JP | 2004-127489 | 4/2004 |
| JP | 2005-083937 | 3/2005 |

OTHER PUBLICATIONS

Gildenblat et al., The Electrical Engineering Handbook, CRC Press LLC, 2000.*

* cited by examiner

*Primary Examiner* — Melissa Koval
*Assistant Examiner* — Daniel Miller
(74) *Attorney, Agent, or Firm* — Drinker Biddle & Reath LLP

(57) ABSTRACT

A capacitance detecting apparatus which can detect the change in minute capacitance of a measuring object with high sensitivity comprises a signal generator, a differential amplifying circuit, and a detecting unit. The signal generator generates a probe signal w(t) to be applied to one end of the measuring object. The differential amplifying circuit amplifies differentially a response signal v1(*t*) developed at the other end of the measuring object in response to the application of the probe signal w(t) and the probe signal w(t). The detecting unit detects capacitance change of the measuring object based on the amplified signal v(t) from the differential amplifying circuit.

20 Claims, 15 Drawing Sheets

(A)

(B)

CAPACITANCE DETECTING APPARATUS

TECHNICAL FIELD

The present invention relates to a technique of detecting capacitance change of a measuring object and particularly to a technique of detecting capacitance change of a measuring object and, based on the detected capacitance change, measuring a pressure applied to the measuring object or a physical quantity such as the angular speed, acceleration, or displacement of the measuring object.

BACKGROUND ART

There are known sensors which detect the capacitance, or capacitance change, of a detecting device that is a measuring object, thereby measuring a physical quantity corresponding to the capacitance or the capacitance change. A conventional technique related to such a sensor is disclosed in, for example, Patent Document 1 (Japanese Patent Kokai No. H11-14482 or Japanese Patent No. 3386336).

In the sensor disclosed in Reference 1, an operational amplifier (op-amp) is used to detect capacitance change of a measuring object. The non-inverting input terminal of the operational amplifier is grounded, and the inverting input terminal thereof is connected to the detecting device via a switch, and a feedback capacitor is connected between the output terminal and the inverting input terminal of the operational amplifier. As the capacitance of the feedback capacitor becomes smaller, the output amplitude of the operational amplifier increases, thus increasing the detection sensitivity, but if the capacitance of the feedback capacitor is too small, the output of the operational amplifier cannot exceed the output dynamic range of the operational amplifier, thus becoming saturated. Thus, there is a limit to the increase in the detection sensitivity. In particular, there is the problem that if a feedback capacitor of small capacitance is used to detect changes in the minute capacitance, the output of the operational amplifier will likely become saturated.

Meanwhile, ferroelectric memory that enables high density recording is being studied as one of next generation large capacity storage media. Ferroelectric material such as $LiTaO_3$ can have spontaneous polarization in each micro domain thereof, and the orientation of the spontaneous polarization can be changed by applying an external electric field. Hence, bit information corresponding to the orientation of the spontaneous polarization can be recorded in the ferroelectric memory. Furthermore, by detecting capacitance change of the ferroelectric material, the orientation of the spontaneous polarization can be detected.

For example, in Patent document 2 (Japanese Patent Kokai No. 2004-127489) and Patent document 3 (European Patent Application Publication No. 1398779), there is disclosed a reproducing apparatus capable of reproducing bit information recorded in the ferroelectric memory. This reproducing apparatus utilizes an LC resonant circuit consisting of a polarized portion having minute capacitance (C) of a ferroelectric memory and an inductor having inductance (L). The reproducing apparatus comprises a probe used to apply an alternate electric field to the ferroelectric memory, an oscillator to oscillate at a frequency determined by the capacitance (C) of the polarized portion and the inductance (L), and an FM demodulator to demodulate the output of the oscillator. The resonant frequency of the LC resonant circuit is at about 1 GHz.

Although the reproducing apparatus disclosed in Reference 2 requires an oscillator and an FM demodulator to realize high resolution, the oscillator and the FM demodulator cannot be said to be suitable in configuration for circuit integration. Moreover, there is the problem that the oscillator and the FM demodulator need to operate at a high frequency band of the order of GHz, hence being easily affected by external noise or static electricity.

Further, in order to detect polarization states recorded in ferroelectric memory as disclosed in Reference 2, changes in the minute capacitance of ferroelectric material need to be detected. However, sensors as described in Reference 1 do not have the capability of detecting changes in such minute capacitance.

Patent Document 1: Japanese Patent Kokai No. H11-14482 (Japanese Patent No. 3386336)
Patent document 2: Japanese Patent Kokai No. 2004-127489
Patent document 3: European Patent Application Publication No. 1398779 (Publication of a counterpart European Patent Application of the Japanese Patent Application as provisionally published as patent document 2)

DISCLOSURE OF THE INVENTION

In view of the above mentioned background, an object of the present invention is to provide a capacitance detecting apparatus that can detect changes in the minute capacitance of a measuring object with high sensitivity. Another object of the present invention is to provide a capacitance detecting apparatus that can detect polarization states in ferroelectric material with high resolution even when operating at a relatively low frequency. Yet another object of the present invention is to provide a capacitance detecting apparatus suitable for circuit integration.

According to an aspect of the present invention, there is provided a capacitance detecting apparatus which gives a detected signal indicating a capacitance change of a measuring object, comprising a signal generator to generate a probe signal of a predetermined frequency and supply the probe signal to one end of the measuring object; a differential amplifying circuit to amplify differentially a response signal obtained from the other end of the measuring object and the probe signal; and a detecting unit to produce the detected signal based on the amplified signal from the differential amplifying circuit.

According to another aspect of the present invention, there is provided a capacitance detecting apparatus which gives a detected signal indicating a change in capacitance of a measuring object, comprising a first signal generator to generate a probe signal of a predetermined frequency and supply the probe signal to one end of the measuring object; a differential amplifying circuit to amplify differentially a response signal obtained from the other end of the measuring object and a reference signal; a second signal generator to generate an inverted signal opposite in phase to the probe signal; an adjustable capacitor connected between the other end of the measuring object and the second signal generator to store charge according to the inverted signal; and a detecting unit to produce the detected signal based on the amplified signal from the differential amplifying circuit.

Figure 1:
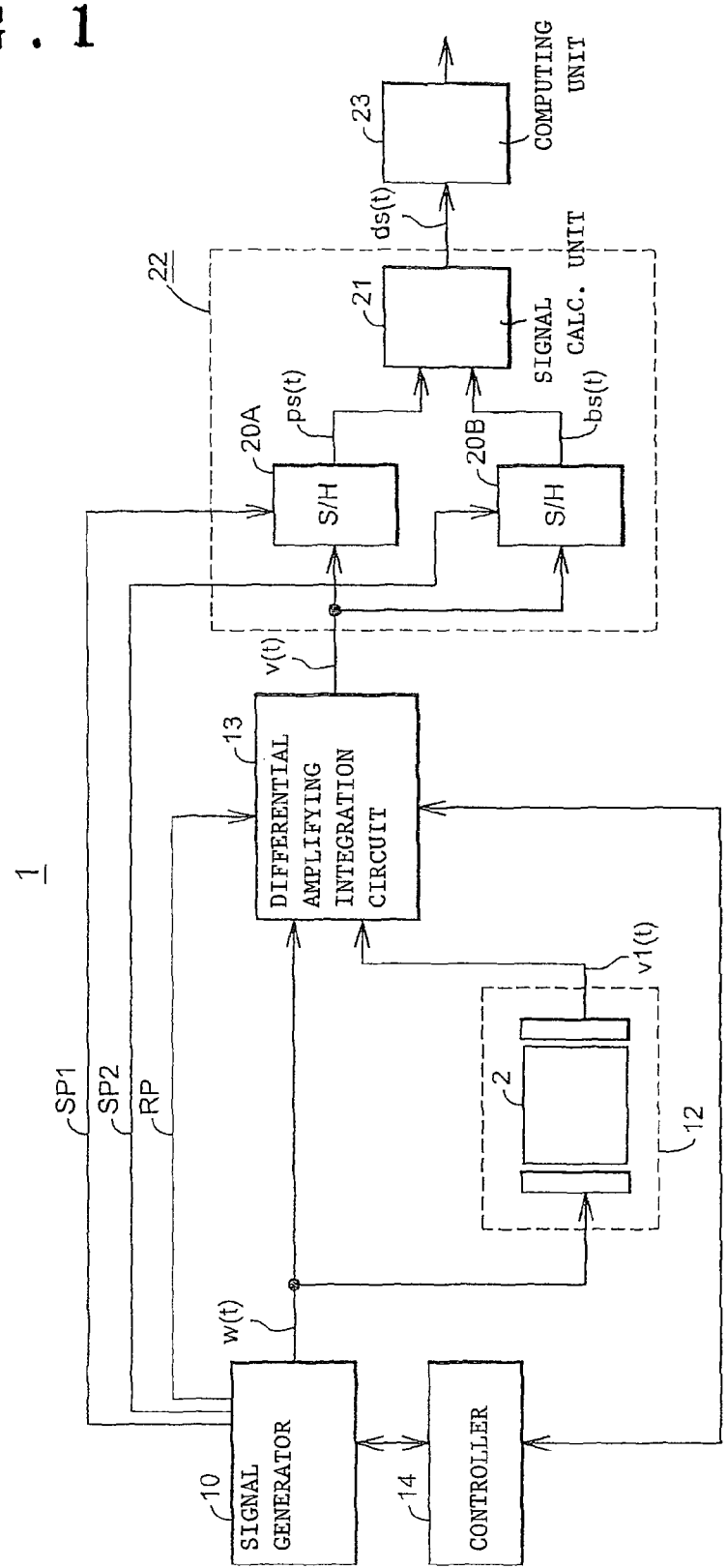
FIG. 1 is a block diagram showing schematically the configuration of a capacitance detecting apparatus according to an embodiment of the present invention.

EXPLANATION OF REFERENCE NUMERALS 1, 1A Capacitance detecting apparatus; 2 Measurement subject; 10, 10B Signal generator; 11 Gain/offset adjustor; 12, 12A Sensor unit; 13 Differential amplifying circuit; 14 Controller

EMBODIMENTS OF THE INVENTION

The present application claims priority from Japanese Patent Application No. 2006-029917, which is herein incorporated by reference.

Various embodiments of the present invention will be described below.

FIG. 1 is a block diagram showing schematically the configuration of a capacitance detecting apparatus 1 according to an embodiment of the present invention. The capacitance detecting apparatus 1 comprises a signal generator 10, a sensor unit 12, a differential amplifying integration circuit 13, a controller 14, a synchronization detecting unit 22, and a computing unit 23. The synchronization detecting unit 22 comprises a first sample-hold circuit (S/H) 20A, a second sample-hold circuit (S/H) 20B, and a signal calculating unit 21. The capacitance detecting apparatus 1 detects capacitance change of a measuring object 2 placed in the sensor unit 12. The measuring object 2 may be, but not limited to, for example, a device that undergoes a displacement according to external air pressure or contact pressure, thus having its capacitance change according to this displacement, or a device whose capacitance changes according to acceleration or angular speed.

The signal generator 10 generates a probe signal w(t) to be applied to one end of the measuring object 2 under the control of the controller 14. As described later, the probe signal w(t) is a pulse signal having a predetermined frequency and a predetermined voltage amplitude. Further, the signal generator 10 generates sampling pulses SP1, SP2 to be respectively supplied to the sample-hold circuits 20A, 20B of the synchronization detecting unit 22, and a reset pulse RP to be supplied to the differential amplifying integration circuit 13.

Figure 2:
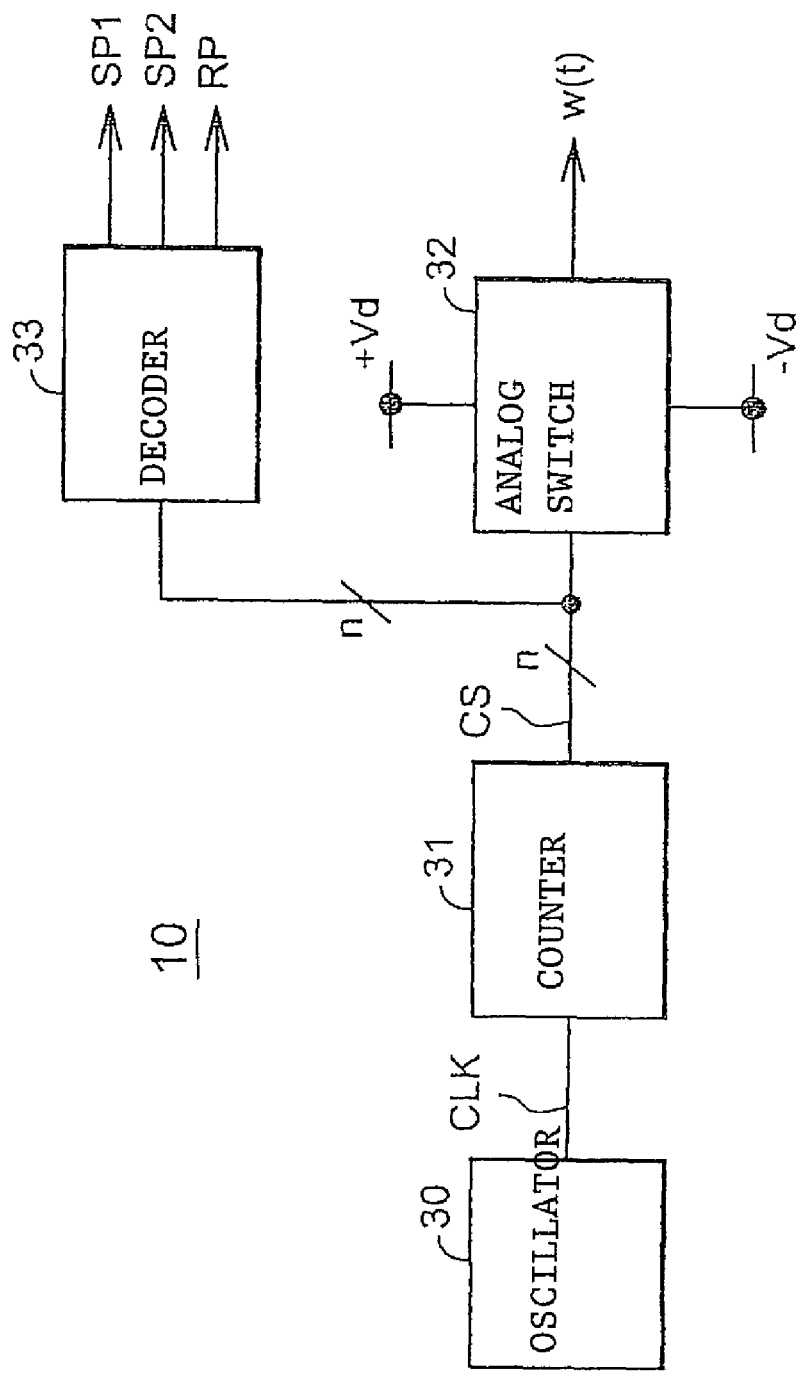
FIG. 2 shows schematically an example of the configuration of a signal generator.

FIG. 2 shows schematically an example of the configuration of the signal generator 10. Referring to FIG. 2, the signal generator 10 comprises an oscillator 30, an n-bit counter 31, where n is an integer of two or greater, an analog switch 32, and a decoder 33. The oscillator 30 generates a highly accurate reference clock CLK using an oscillation element such as a crystal resonator and supplies this reference clock CLK to the counter 31. The counter 31 counts pulses of the reference clock CLK and gives an output CS of an n-bit binary value representing the count. The decoder 33 generates the sampling pulses SP1, SP2 and the reset pulse RP based on the output CS of the counter 31.

The analog switch 32 has supplied thereto a supply voltage +Vd of positive voltage polarity relative to a reference potential Vref and a supply voltage −Vd of negative voltage polarity relative to the reference potential Vref. Further, based on the output CS of the counter 31, the analog switch 32 can generate a pulse signal consisting of pulses of voltage +Vd and pulses of voltage −Vd as the probe signal w(t) using the supply voltage +Vd and the supply voltage −Vd. The analog switch 32 can set variably the amplitude, voltage polarity, pulse width, and frequency in combination of the pulse signal according to control signals from the controller 14. The analog switch 32 may have a low pass filter to remove noise components contained in the pulse signal.

In this embodiment, the reference potential Vref is at GND level (ground level). In order to generate the probe signal w(t), the analog switch 32 uses the voltage +Vd of positive polarity and the voltage −Vd of negative polarity relative to the reference potential Vref, but the invention is not limited to this. For example, the analog switch 32 may generate the probe signal w(t) using a supply voltage Vp (=2×Vref) of positive voltage polarity relative to a reference potential Vref higher than GND level and a supply voltage Vn (=GND level) of negative voltage polarity relative to the reference potential Vref.

Referring to FIG. 1, having the probe signal w(t) from the signal generator 10 applied to one end of the measuring object 2, the sensor unit 12 supplies a response signal v1(t) developed at the other end of the measuring object 2 in response to the application of the probe signal w(t) to the differential amplifying integration circuit 13.

The differential amplifying integration circuit 13 (hereinafter simply called a differential amplifying circuit 13) amplifies differentially the probe signal w(t) from the signal generator 10 and the response signal v1(t) from the sensor unit 12 and gives an amplified signal v(t) to each of the sample-hold circuits 20A, 20B.

The first sample-hold circuit 20A samples and holds a positive peak level (local maximum in voltage level) of the amplified signal v(t) from the differential amplifying circuit 13 according to the sampling pulse SP1 and gives a peak signal ps(t) containing the sampled positive peak levels to the signal calculating unit 21. Meanwhile, the second sample-hold circuit 20B samples and holds a negative peak level (local minimum in voltage level) of the amplified signal v(t) from the differential amplifying circuit 13 according to the sampling pulse SP2 and gives a bottom signal bs(t) containing the sampled negative peak level to the signal calculating unit 21. The signal calculating unit 21 is an adder/subtractor that adds the positive peak level of the peak signal ps(t) and the negative peak level of the bottom signal bs(t) together or subtracts one from the other of the positive peak level and the negative peak level. The signal calculating unit 21 can selectively perform either addition or subtraction under the control of the controller 14, thereby generating a detected signal ds(t). The computing unit 23 can calculate a pressure applied to the measuring object 2 or a physical quantity such as the angular speed, acceleration, or displacement of the measuring object 2 based on the detected signal ds(t).

First Embodiment

Figure 3:
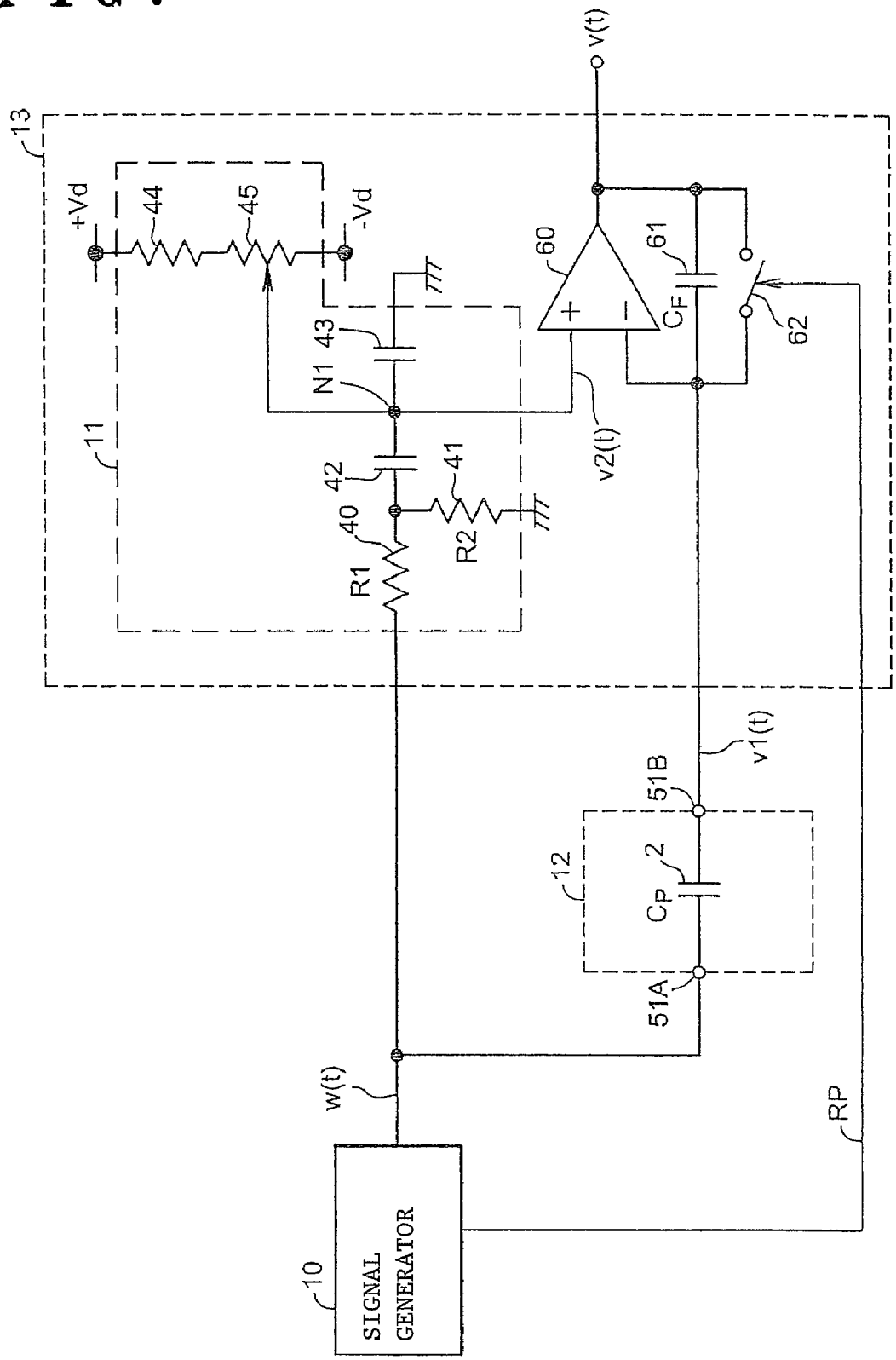
FIG. 3 shows an example of the configuration of a gain/offset adjustor and a differential amplifying circuit.

A first embodiment of the present invention will be described below. FIG. 3 shows an example of the configuration of the differential amplifying circuit 13 according to the first embodiment. The differential amplifying circuit 13 has an operational amplifier 60 comprising a feedback capacitor 61 and a reset switch 62, and a gain/offset adjustor 11. The gain/offset adjustor 11 adjusts the voltage amplitude of the probe signal w(t) and simultaneously performs offset adjustment to shift the center voltage of the probe signal w(t). A signal v2(t) adjusted in the gain/offset adjustor 11 is input to the non-inverting input terminal (+) of the operational amplifier 60, and the response signal v1(t) from the sensor unit 12 is input to the inverting input terminal (−) of the operational amplifier 60. The feedback capacitor 61 of a predetermined capacitance $C_F$ is connected between the inverting input terminal (−) and the output terminal of the operational amplifier 60, and the reset switch 62 is connected in parallel with the feedback capacitor 61. When the reset switch 62 becomes ON to be conductive in response to the reset pulse RP, opposite ends of the feedback capacitor 61 are short-circuited, so that the charge stored in the feedback capacitor 61 is discharged.

In the sensor unit 12, connection terminals 51A, 51B are connected directly to the measuring object 2, or placed adjacent to and a predetermined space apart from the measuring object 2. The measuring object 2 has a capacitance $C_P$ between these connection terminals 51A, 51B. When the probe signal w(t) is applied to one end of the measuring object 2 via the connection terminal 51A, in response to this application the response signal v1(t) occurs on the connection terminal 51B and is supplied to the inverting input terminal (−) of the operational amplifier 60.

The gain/offset adjustor 11 shown in FIG. 3 has an amplitude adjusting circuit comprising a first resistor 40 of resistance R1 and a second resistor 41 of resistance R2 and further has a first capacitor 42 used to remove the DC component of the probe signal w(t) and a second capacitor 43 used to remove noise in the high band component of the probe signal w(t). By setting the values of the resistances R1, R2 as needed, the voltage of the probe signal w(t) can be adjusted to an optimum level. One end of the first resistor 40 is connected to the signal generator 10; the other end of the first resistor 40 is connected to one end of the second resistor 41; and the other end of the second resistor 41 is grounded. The first capacitor 42 and the second capacitor 43 are serially connected, and one end of the second capacitor 43 is grounded. The adjusted signal v2(t) is supplied from the connection point N1 between the first capacitor 42 and the second capacitor 43 to the differential amplifying circuit 13.

The gain/offset adjustor 11 further has an offset adjusting circuit comprising a resistor 44 and a variable resistor 45 serially connected. The supply voltage +Vd of positive polarity is supplied to one end of the resistor 44, and the supply voltage −Vd of negative polarity is supplied to one end of the variable resistor 45. The connection point N1 is connected to the variable resistor 45. By adjusting the resistance value of the variable resistor 45, the center voltage of the probe signal w(t) can be adjusted to a desired level.

The gain/offset adjustor 11 adjusts the voltage amplitude and offset (difference between the center voltage and the desired level) of the probe signal w(t) and supplies the adjusted signal v2(t) to the operational amplifier 60, and the operational amplifier 60 amplifies the voltage difference between the inverting input terminal (−) and the non-inverting input terminal (+) using the voltage of the adjusted signal v2(t) as a reference voltage (differentially amplifying them). Thus, even if the capacitance $C_F$ of the feedback capacitor 61 is set smaller to increase detection sensitivity, the output of the operational amplifier 60 can be prevented from being saturated, and also the S/N ratio (signal-to-noise ratio) can be improved.

In the conventional art, a constant reference voltage (e.g., ground voltage) is applied to the non-inverting input terminal (+) of the operational amplifier 60, and hence if the capacitance $C_F$ of the feedback capacitor 61 is set too small in order to increase detection sensitivity, the amplified signal v(t), which is the output of the operational amplifier 60, cannot exceed the output dynamic range of the operational amplifier 60, thus becoming saturated. In contrast, the present embodiment is configured such that with using the adjusted signal v2(t) having substantially the same phase characteristic as the response signal v1(t) as a reference signal, this adjusted signal v2(t) is input to the non-inverting input terminal (+). Further, the voltage amplitude and center voltage of the adjusted signal v2(t) can be adjusted in the gain/offset adjustor 11 such that the amplified signal v(t) falls within the output dynamic range of the operational amplifier 60. Thus, the voltage level of the amplified signal v(t) can be limited to within an appropriate range without reaching the saturated level even if the capacitance $C_F$ is set small. Therefore, capacitance change $C_P$ of the measuring object 2 can be detected with high sensitivity.

In the example shown in FIG. 3 the number of combinations of the feedback capacitor 61 and the reset switch 62 is one, but not being limited to this, a plurality of combinations of a feedback capacitor and a reset switch may be connected between the inverting input terminal (−) and the output terminal. By this means, it becomes possible to select the feedback capacitor having optimum capacitance for the measuring object 2 to adjust detection sensitivity.

Figure 4:
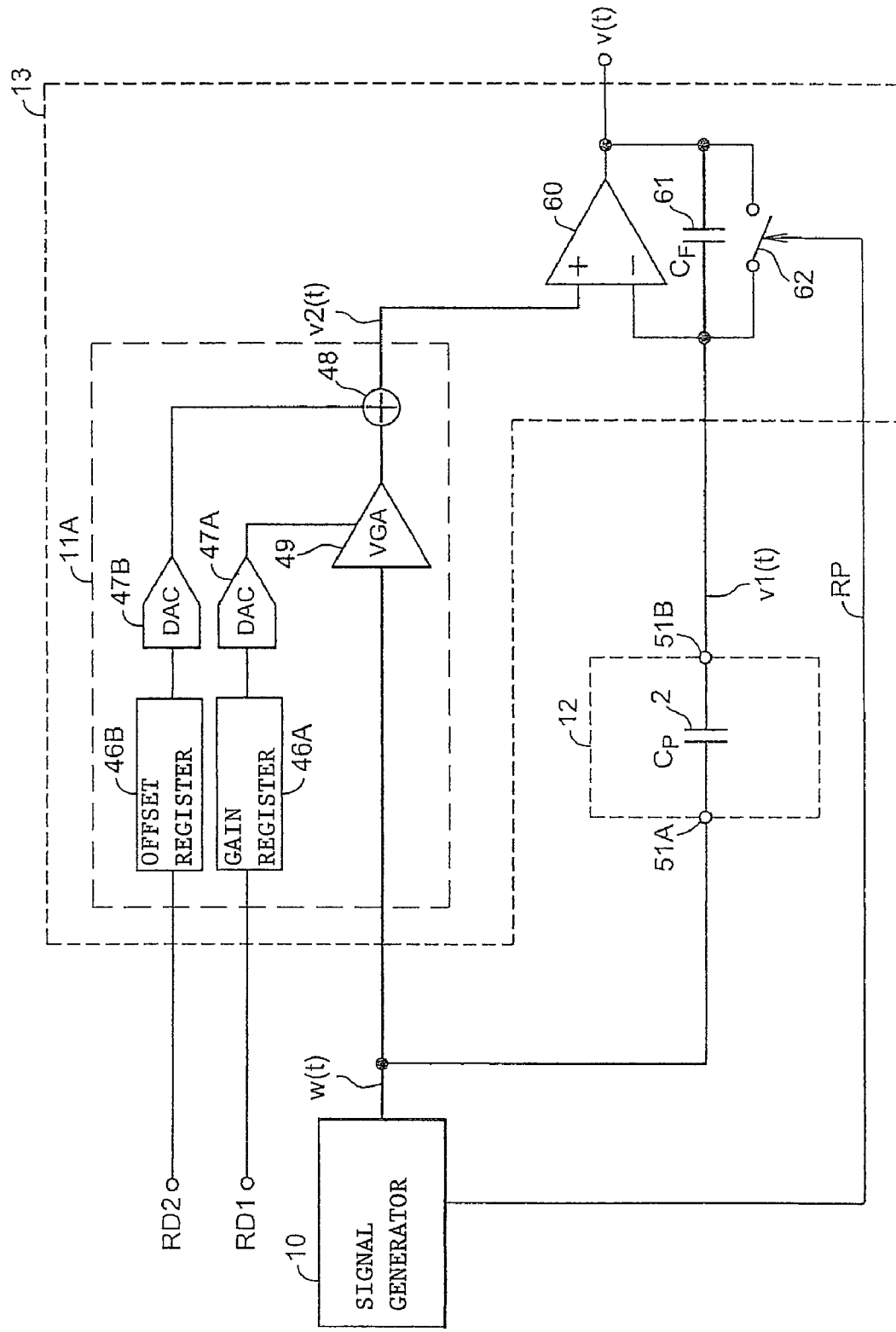
FIG. 4 shows another example of the configuration suitable for circuit integration.

The configuration shown in FIG. 3 is suitable for circuit integration. That is, the signal generator 10, the gain/offset adjustor 11, and the differential amplifying circuit 13 can be easily designed so as to be incorporated in an integrated circuit. FIG. 4 shows a configuration further suitable for circuit integration. The configuration shown in FIG. 4 is the same as in FIG. 3 except for a gain/offset adjustor 11A.

Referring to FIG. 4, the gain/offset adjustor 11A comprises a gain register 46A, an offset register 46B, D/A converters (DACs) 47A, 47B, an analog adder 48, and a variable gain amplifier (VGA) 49. The gain register 46A and the offset register 46B hold the values of control signals RD1, RD2 given from the controller 14 (FIG. 1) respectively. The D/A converter 47A performs D/A-conversion of the output of the gain register 46A and supplies the converted signal to the variable gain amplifier 49. The variable gain amplifier 49 can amplify the voltage amplitude of the probe signal w(t) with the gain corresponding to the voltage of the converted signal from the D/A converter 47A. Meanwhile, the D/A converter 47B performs D/A-conversion of the output of the offset register 46B and supplies the converted signal to the analog adder 48. The analog adder 48 adds the converted signal from the D/A converter 47B to the amplified signal from the variable gain amplifier 49, thereby shifting the center voltage of the probe signal w(t).

The gain of the variable gain amplifier 49 can be set variably according to the control signal RD1 from the controller 14, and the offset adjustment amount of the probe signal w(t) can be set variably according to the control signal RD2 from the controller 14. Hence, the offset adjustment amount and gain can be set appropriately such that the voltage level of the amplified signal v(t) falls within the output dynamic range of the operational amplifier 60 without reaching the saturated level.

Figure 5:
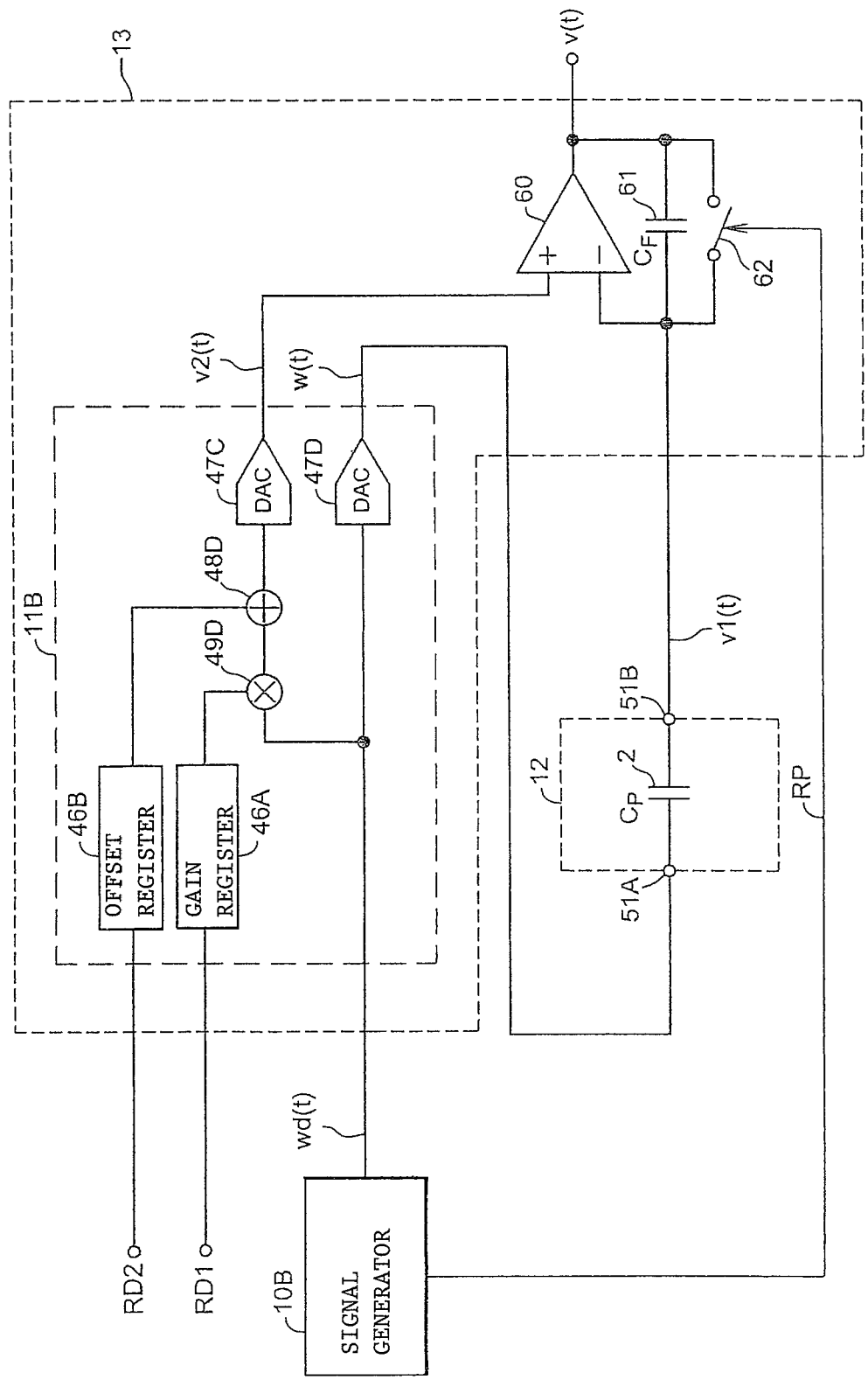
FIG. 5 shows yet another example of the configuration suitable for circuit integration.

FIG. 5 shows yet another example of the differential amplifying circuit 13 suitable for circuit integration. The configuration shown in FIG. 5 is the same as in FIG. 3 except for a gain/offset adjustor 11B and a signal generator 10B. The gain/offset adjustor 11B of FIG. 5 comprises the gain register 46A, the offset register 46B, a digital multiplier 49D, a digital adder 48D, and D/A converters (DACs) 47C, 47D. The signal generator 10B outputs a digital probe signal wd(t), and the D/A converter 47D performs a D/A-conversion of the digital probe signal wd(t) and gives the converted signal as the probe signal w(t). The gain register 46A, the digital multiplier 49D, and the D/A converter 47C form a digital amplifying circuit (amplitude adjusting circuit), and the offset register 46B, the digital adder 48D, and the D/A converter 47C form an offset adjusting circuit. Note that the registers 46A, 46B, the digital multiplier 49D, and the digital adder 48D may be constituted by a digital signal processing processor such as a DSP (Digital Signal Processor).

The gain register 46A and the offset register 46B shown in FIG. 5 hold the values of the control signals RD1, RD2 from the controller 14 (FIG. 1) respectively. the digital multiplier 49D multiplies the digital probe signal wd(t) from the signal generator 10B by the output of the gain register 46A, and the digital adder 48D adds the output of the offset register 46B to the output of the digital multiplier 49D. The D/A converter 47C performs D/A-conversion of the digital signal from the digital adder 48D, thereby producing the adjusted signal v2(t).

By adjusting the value held in the gain register 46A, the gain of the digital amplifying circuit can be set variably, and by adjusting the value held in the offset register 46B, the offset adjustment amount of the adjusted signal v2(t) can be set variably. Hence, the adjusted signal v2(t) amplified with a desired gain from the probe signal w(t) and adjusted in offset can be obtained. Thus, the offset adjustment amount and gain can be set appropriately such that the voltage level of the amplified signal v(t) falls within the output dynamic range of the operational amplifier 60 without reaching the saturated level.

Figure 6:
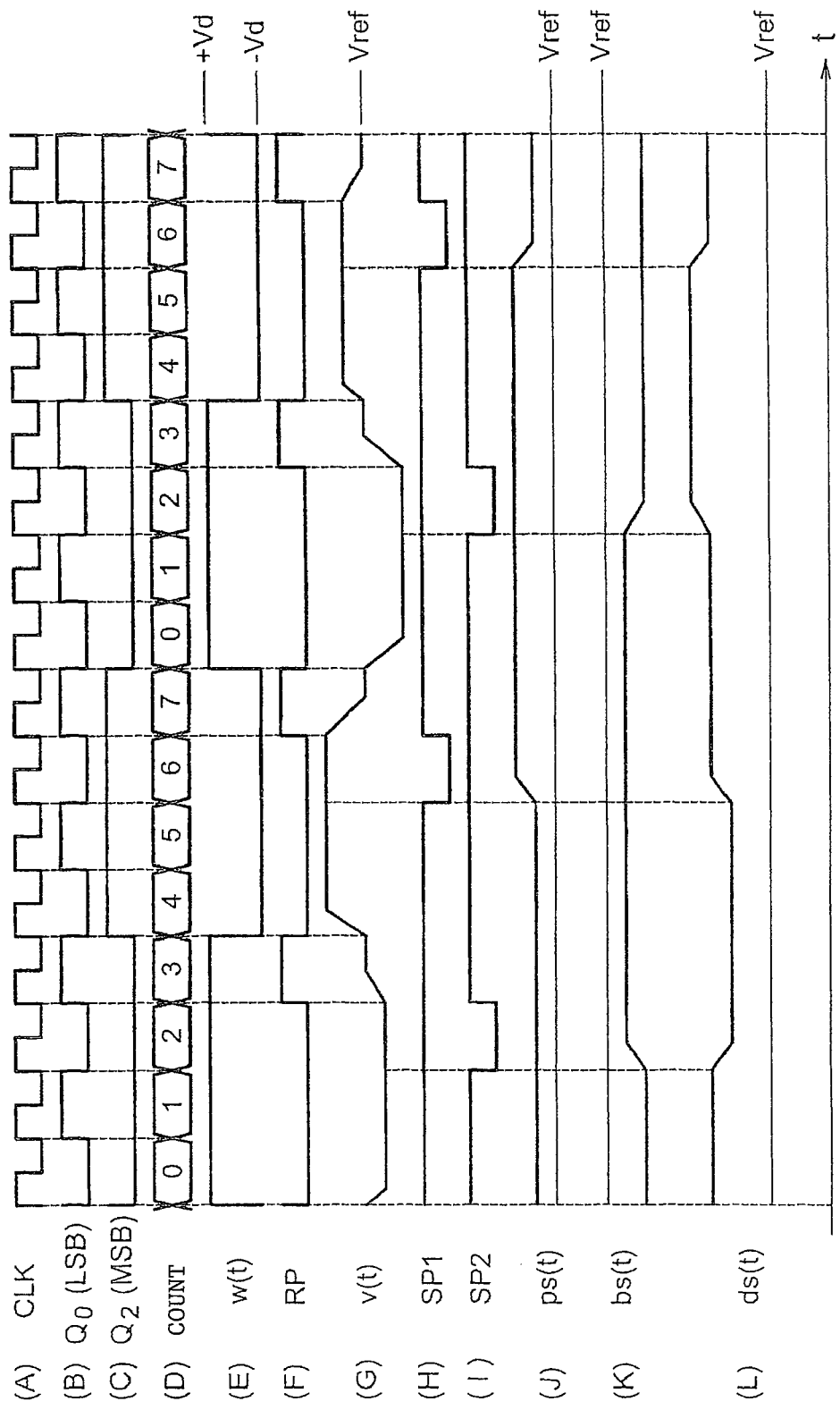
FIG. 6 is a timing chart for explaining the operation of the capacitance detecting apparatus according to a first embodiment.

Referring to the timing charts of FIG. 6, (A) to (L), an example operation of the capacitance detecting apparatus 1 will be described in detail below. In this example, the oscillator 30 of FIG. 2 generates a reference clock CLK shown in FIG. 6(A), and the counter 31 of FIG. 2 counts pulses of the reference clock CLK to generate a three-bit binary value of $Q_0, Q_1, Q_2$. The counter 31 divides the reference clock CLK by two to generate the least significant bit (LSB) $Q_0$ as shown in FIG. 6(B) and simultaneously divides the reference clock CLK by eight to generate the most significant bit (MSB) $Q_2$ as shown in FIG. 6(C). FIG. 6(D) shows the count held in the counter 31.

The analog switch 32 of FIG. 2 generates alternately positive polarity pulses of the positive polarity voltage +Vd and negative polarity pulses of the negative polarity voltage −Vd as the probe signal w(t) synchronously with the most significant bit (MSB) $Q_2$. That is, when the signal level of the most significant bit (MSB) $Q_2$ is at a low level, a positive polarity pulse is generated, and when the signal level of the most significant bit (MSB) $Q_2$ is at a high level, a negative polarity pulse is generated. These positive and negative polarity pulses are supplied as the probe signal w(t) to the gain/offset adjustor 11.

During the time that the analog switch 32 applies a positive polarity pulse of the probe signal w(t) to the one end of the measuring object 2, the voltage level of the output v(t) of the operational amplifier 60 falls and reaches a negative peak level as shown in FIG. 6(G). In contrast, during the time that the analog switch 32 applies a negative polarity pulse of the probe signal w(t) to the one end of the measuring object 2, the voltage level of the output v(t) of the operational amplifier 60 rises and reaches a positive peak level as shown in FIG. 6(G).

Meanwhile, the decoder 33 of FIG. 2 generates a reset pulse RP of a high level immediately before each of the positive and negative polarity pulses of the probe signal w(t) is generated as shown in FIG. 6(F). This reset pulse RP turns on the reset switch 62 of the differential amplifying circuit 13 of FIG. 3 to make the charge stored in the feedback capacitor 61 discharged. Thereby, the voltage level of the output v(t) of the operational amplifier 60 is held at the reference potential Vref before rising or falling.

The first sample-hold circuit 20A of FIG. 1 samples a positive peak level of the amplified signal v(t) at the falling edge of a sampling pulse SP1 shown in FIG. 6(H) and holds this. As a result, the peak signal ps(t) takes on a waveform having the positive peak level as shown in FIG. 6(J). The second sample-hold circuit 20B of FIG. 1 samples a negative peak level of the amplified signal v(t) at the falling edge of a sampling pulse SP2 shown in FIG. 6(I) and holds this. As a result, the bottom signal bs(t) takes on a waveform having the negative peak level as shown in FIG. 6(K).

The signal calculating unit 21 of FIG. 1 subtracts the negative peak level of negative voltage polarity from the positive peak level of positive voltage polarity relative to the reference potential Vref, thereby generating the detected signal ds(t) indicating a peak-to-peak voltage as shown in FIG. 6(L). As described below, because the voltage variation amount of the detected signal ds(t) is substantially proportional to the amount of change $\Delta C_P$ in the capacitance $C_P$ of the measuring object 2, by monitoring the voltage of the detected signal ds(t), the capacitance variation of the measuring object 2 can be detected.

Figure 7:
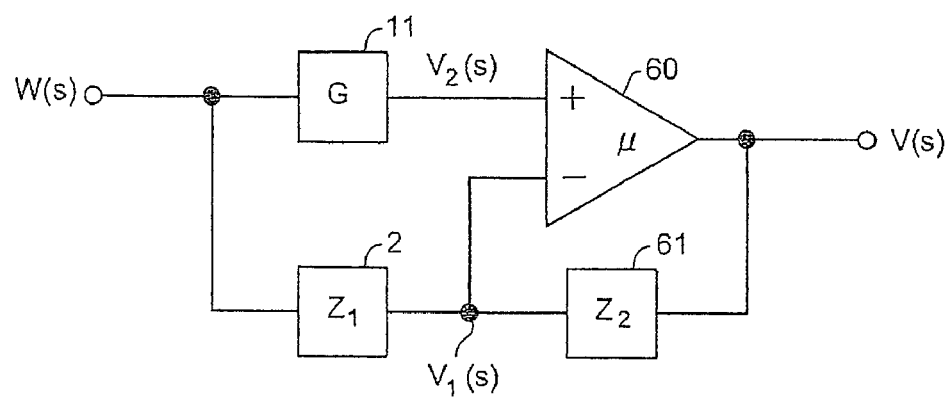
FIG. 7 is a block diagram showing schematically a part of the configuration of the capacitance detecting apparatus according to the first embodiment.

The theoretical background will be described below. FIG. 7 is a block diagram showing a system comprising the gain/offset adjustor 11, the measuring object 2, the operational amplifier 60, and the feedback capacitor 61. In FIG. 7, let W(s), $V_1(s)$, $V_2(s)$, and V(s) be Laplace transforms for the functions of time t, i.e., w(t), v1(t), v2(t), and v(t) shown in FIG. 3 respectively, where s is the variable (Laplace operator) of the Laplace transforms. Further, let $Z_1(s)$ be the transfer characteristic (impedance) of the measuring object 2, μ be the open loop gain of the operational amplifier 60, and $Z_2(s)$ be the transfer characteristic (impedance) of the feedback capacitor 61. For convenience of description, the transfer characteristic G of the gain/offset adjustor 11 indicates only the gain.

When the input impedance of the operational amplifier 60 is substantially infinite, the following equations (1) and (2) are given:

$$V(s) = \mu \times (-V_1(s) + V_2(s)). \tag{1}$$

$$\begin{cases} V_1(s) = \dfrac{Z_2(s) \times W(s) + Z_1(s) \times V(s)}{Z_1(s) + Z_2(s)} \\ V_2(s) = G \times W(s) \end{cases} \quad (2)$$

Substituting $V_1(s)$, $V_2(s)$ of the equation (2) into the equation (1) and rewriting the equation (1), the following equation (3) is obtained:

$$V(s) = \dfrac{-Z_2(s) + G \times (Z_1(s) + Z_2(s))}{(Z_1(s) + Z_2(s))/\mu + Z_1(s)} W(s). \quad (3)$$

Since the capacitance of the measuring object 2 is denoted as $C_P$, the transfer characteristic of the measuring object 2 is expressed as $Z_1(s) = 1/(C_P \times s)$. Also since the capacitance of the feedback capacitor 61 is denoted as $C_F$, the transfer characteristic of the feedback capacitor 61 is expressed as $Z_2(s) = 1/(C_F \times s)$. Thus the equation (3) can be rewritten as the following equation (4):

$$\dfrac{V(s)}{W(s)} = \dfrac{-C_P/C_F + G \times (1 + C_P/C_F)}{(1 + C_P/C_F)/\mu + 1}. \quad (4)$$

Assuming that the open loop gain $\mu$ is substantially infinite, the transfer function $V(s)/W(s)$ of the equation (4) is rewritten as the following equation (4a):

$$\dfrac{V(s)}{W(s)} = \dfrac{1}{C_F} \times (G \times C_F + (G-1) \times C_P). \quad (4a)$$

In the equation (4a), replacing the Laplace operator s by $j\omega$, where j is the imaginary unit and $\omega$ is an angular frequency, the frequency transfer function $V(j\omega)/W(j\omega)$ is obtained.

Since the gain G of the gain/offset adjustor 11 is constant and also the capacitance $C_F$ of the feedback capacitor 61 is constant, the amount of change in the transfer function $V(s)/W(s)$ expressed by the equation (4a) is given by the following equation (4b):

$$\Delta\left(\dfrac{V(s)}{W(s)}\right) = (G-1) \times \dfrac{\Delta C_P}{C_F}. \quad (4b)$$

As apparent from the equation (4b), the amount of change in the transfer function $V(s)/W(s)$ is proportional to the amount of change $\Delta C_P$ in the capacitance $C_P$ of the measuring object 2. Because the amplitude values +Vd, −Vd of the applied probe signal w(t) are each constant, by detecting changes in the detected signal ds(t) indicating the peak-to-peak voltage of the amplified signal v(t), capacitance change of the measuring object 2 can be detected.

Desirably the gain G of the gain/offset adjustor 11 is adjusted such that the amplitude of the amplified signal v(t) becomes substantially zero in an initial state before the capacitance change is detected. This is for preventing the voltage level of the amplified signal v(t) from reaching the saturated level as much as possible when the capacitance $C_P$ of the measuring object 2 changes from the capacitance $C_P(0)$ at the initial state.

If the amplitude of the amplified signal v(t) is always at zero, the left side of the equation (4a) becomes zero. Here, the equation (4a) is rewritten as the following equation (5):

$$G = C_P(0)/(C_P(0) + C_F). \quad (5)$$

Thus, if the capacitance $C_P(0)$ at the initial state is known, an appropriate gain G can be determined using the equation (5).

Or, using the gain/offset adjustor 11 shown in FIG. 4, the gain G of the variable gain amplifier 49 can be adjusted such that the amplitude of the amplified signal v(t) becomes substantially zero. That is, the controller 14 of FIG. 1 can change the gain G of the variable gain amplifier 49 stepwise by units of 0.5 dB by changing stepwise the value of the control signal RD1 that is given to the gain register 46A of FIG. 4. The controller 14 determines at each step whether the amplitude of the amplified signal v(t) measured in the computing unit 23 of FIG. 1 is substantially at zero, or the controller 14 may search for the step where the amplitude of the amplified signal v(t) is closest to zero. Then, the controller 14 can determine the gain G at the step where the amplitude of the amplified signal v(t) is substantially at zero or the gain G at the step where the amplitude of the amplified signal v(t) is closest to zero.

Rewriting the equation (5), the capacitance $C_P(0)$ at the initial state is given by the following equation (6):

$$C_P(0) = C_F \times G/(1-G). \quad (6)$$

Once the gain G is determined in the above way, the capacitance $C_P(0)$ can be calculated using the equation (6).

Substituting the gain G of the equation (5) into the equation (4a) and rewriting the equation (4a), the transfer function $V(s)/W(s)$ is given by the following equation (7):

$$V(s)/W(s) = (C_P(0) - C_P)/(C_P(0) + C_F). \quad (7)$$

When the amount of change $\Delta C_P$ in the capacitance of the measuring object 2 is expressed as $\Delta C_P = C_P - C_P(0)$ the equation (7) can be rewritten as the following equation (8):

$$V(s)/W(s) = -\Delta C_P/(C_P(0) + C_F). \quad (8)$$

If the capacitance $C_F$ of the feedback capacitor 61 is set to be k times the capacitance $C_P(0)$ of the measuring object 2, where k is a real number, i.e., if the equation $C_F = k \times C_P(0)$ is satisfied, the equation (8) can be rewritten as the following equation (9):

$$\dfrac{V(s)}{W(s)} = \dfrac{-1}{1+k} \times \dfrac{\Delta C_P}{C_P(0)}. \quad (9)$$

Thus, the transfer function $V(s)/W(s)$ for when the coefficient k is 1.0 and 0.1 is given by the following equations (9a), (9b) respectively:

$$\dfrac{V(s)}{W(s)} \cong \begin{cases} -0.5 \times \Delta C_P/C_P(0) & \text{for } k = 1.0 \quad (9a) \\ -0.9 \times \Delta C_P/C_P(0) & \text{for } k = 0.1 \quad (9b) \end{cases}$$

As illustrated in the equations (9a), (9b), it is found that as the capacitance $C_F$ of the feedback capacitor 61 becomes smaller, the sensitivity in detecting capacitance change of the measuring object 2 increases.

Second Embodiment

Figure 8:
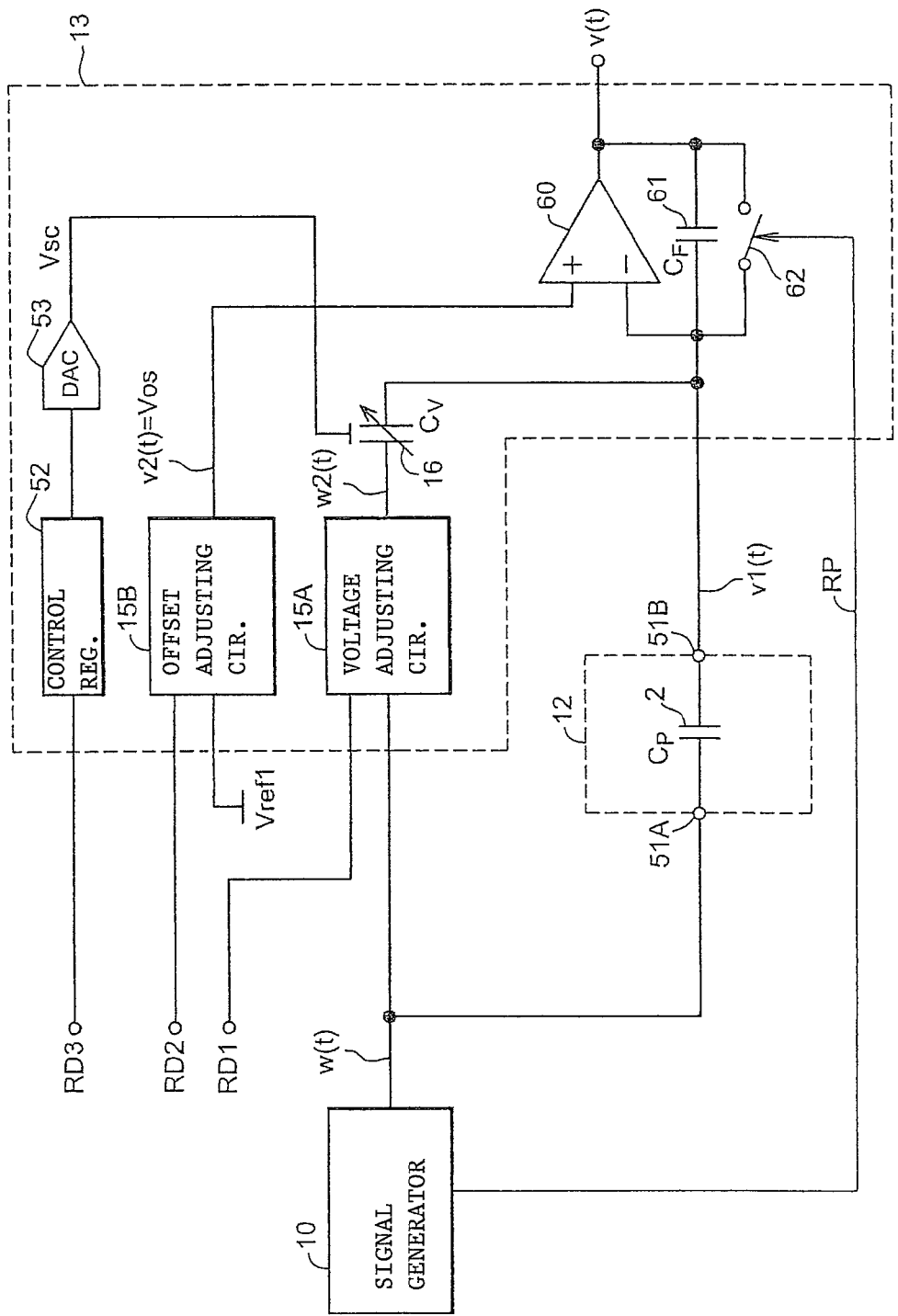
FIG. 8 shows schematically an example of the configuration of a differential amplifying circuit of a second embodiment according to the present invention.

Next, a second embodiment of the present invention will be described. FIG. 8 shows schematically an example of the configuration of a differential amplifying circuit 13 according to the second embodiment. This differential amplifying circuit 13 has an operational amplifier 60 comprising a feedback capacitor 61 and a reset switch 62 as in the first embodiment. Also the differential amplifying circuit 13 has a control register 52, a D/A converter (DAC) 53, a voltage adjusting circuit 15A, an offset adjusting circuit 15B, and an adjustable capacitor 16. In FIG. 8, the signal generator 10 corresponds to a "first signal generator to generate a probe signal" of the present invention, and the voltage adjusting circuit 15A corresponds to a "second signal generator to generate an inverted signal" of the present invention.

The voltage adjusting circuit 15A is connected to the signal generator 10 and to the inverting input terminal (−) of the operational amplifier 60 via the adjustable capacitor 16 and is connected in parallel with the measuring object 2 of the sensor unit 12 via the adjustable capacitor 16. The voltage adjusting circuit 15A has a function to invert the phase of the probe signal w(t) from the signal generator 10, thereby generating an inverted signal w2(t) and to simultaneously adjust the voltage amplitude of the probe signal w(t) according to the control signal RD1 from the controller 14 (FIG. 1).

The adjustable capacitor 16 is interposed between the signal generator 10 and the inverting input terminal (−) of the operational amplifier 60 and is connected serially to the voltage adjusting circuit 15A. Charge according to the inverted signal w2(t) that is the output of the voltage adjusting circuit 15A is stored in the adjustable capacitor 16. The control register 52 holds the value of a control signal RD3 from the controller 14 (FIG. 1). The D/A converter 53 performs D/A-conversion of the output of the control register 52 and gives the converted signal to the adjustable capacitor 16. The adjustable capacitor 16 is a variable capacitor having capacitance variable according to the voltage Vsc of the converted signal from the D/A converter 53.

Figure 9:
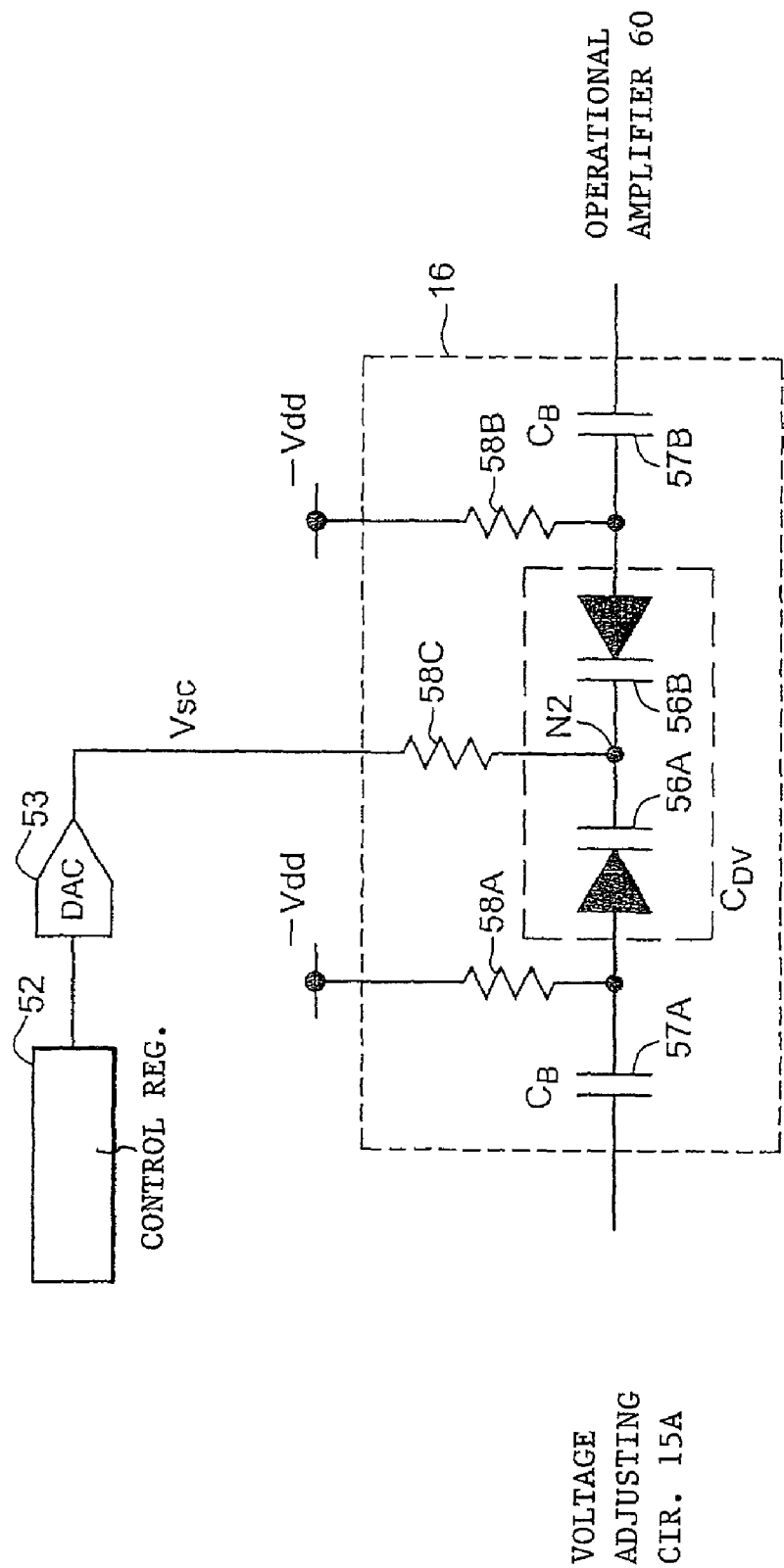
FIG. 9 shows schematically an example of the configuration of an adjustable capacitor that is a variable capacitor.

FIG. 9 shows schematically an example of the configuration of the adjustable capacitor 16. The adjustable capacitor 16 of FIG. 9 comprises a pair of variable capacitance diodes 56A, 56B serially connected, two capacitors 57A, 57B, and three resistors 58A, 58B, 58C. The variable capacitance diodes 56A, 56B may be embodied by, e.g., varactor diodes. The cathode of the one variable capacitance diode 56A is connected to the cathode of the other variable capacitance diode 56B, and the connection middle point N2 between these variable capacitance diodes 56A, 56B of the pair is connected to the output end of the D/A converter 53 via the resistor 58C. The anode of the one variable capacitance diode 56A is connected to the voltage adjusting circuit 15A via the capacitor 57A having capacitance $C_B$, and the anode of the other variable capacitance diode 56B is connected to the inverting input terminal (−) of the operational amplifier 60 via the capacitor 57B having capacitance $C_B$. The capacitors 57A, 57B are coupling capacitors to cut off the DC component. If the capacitance $C_B$ of these capacitors 57A, 57B and the series capacitance $C_{DV}$ of the variable capacitance diodes 56A, 56B are set such that $C_B$ is very much greater than $C_{DV}$ (i.e., $C_B \gg C_{DV}$), the capacitance $C_V$ of the adjustable capacitor 16 can be considered to be substantially equal to the series capacitance $C_{DV}$.

When the control voltage Vsc from the D/A converter 53 is applied as a reverse bias voltage to the cathodes of the variable capacitance diodes 56A, 56B, the capacitance of the variable capacitance diodes 56A, 56B can vary according to the control voltage. Thus, by adjusting the value held in the control register 52, the capacitance $C_V$ of the adjustable capacitor 16 can be set at a desired value.

Instead of the adjustable capacitor 16 of FIG. 8, a plurality of capacitors having different fixed capacitances connected in parallel with each other and a switching element (not shown) may be used. In this case, the switching element selects one of the plurality of capacitors according to the control signal RD3 from the controller 14 (FIG. 1) and connects the selected capacitor in parallel with the measuring object 2 of the sensor unit 12.

Referring to FIG. 8, the offset adjusting circuit 15B has a function to shift the center voltage of a reference signal having a substantially constant reference voltage Vref1 to a desired level according to the control signal RD2 from the controller 14 (FIG. 1), thereby adjusting the offset (difference between the center voltage and the desired level) of the reference signal. Hence, the offset adjusting circuit 15B supplies an adjusted signal v2(t) having a substantially constant voltage Vos to the non-inverting input terminal (+) of the operational amplifier 60. The reference voltage Vref1 may be set at ground level, but is not limited to this.

Figure 10:
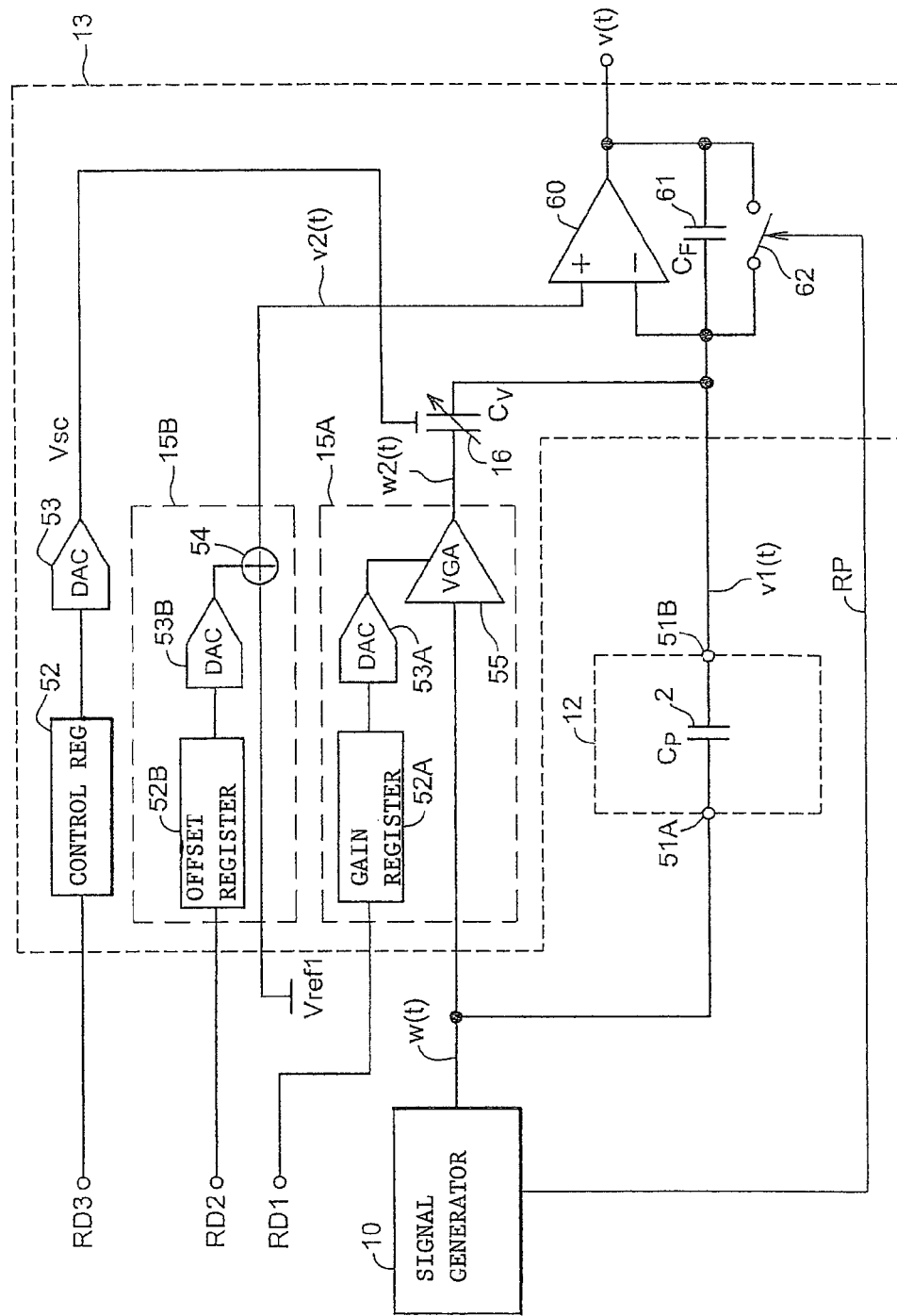
FIG. 10 shows an example of the specific configuration of a voltage adjusting circuit and an offset adjusting circuit of the second embodiment.

FIG. 10 shows an example of the specific configurations of the voltage adjusting circuit 15A and the offset adjusting circuit 15B. As shown in FIG. 10, the voltage adjusting circuit (amplitude adjusting circuit) 15A comprises a gain register 52A, a D/A converter (DAC) 53A, and a variable gain amplifier (VGA) 55. The gain register 52A holds the value of the control signal RD1 given from the controller 14 (FIG. 1). The D/A converter 53A performs D/A-conversion of the output of the gain register 52A and supplies the converted signal to the variable gain amplifier 55. The variable gain amplifier 55 can, inverting its phase, amplify the voltage amplitude of the probe signal w(t) with the gain corresponding to the voltage of the converted signal from the D/A converter 53A. If the gain of the variable gain amplifier 55 is set, e.g., at −1, the voltage adjusting circuit 15A converts the probe signal w(t) into an inverted signal −w(t) (=w2(t)).

Meanwhile, as shown in FIG. 10, the offset adjusting circuit 15B comprises an offset register 52B, a D/A converter (DAC) 53B, and an analog adder 54. The offset register 52B holds the value of the control signal RD2 given from the controller 14 (FIG. 1). The D/A converter 53B performs D/A-conversion of the output of the offset register 52B and supplies the converted signal to the analog adder 54. The analog adder 54 can add the voltage of the converted signal to the reference voltage Vref1, thereby performing offset adjustment.

As described above, in the differential amplifying circuit 13 of the second embodiment, the voltage adjusting circuit 15A generates the inverted signal w2(t) opposite in phase to the probe signal w(t), and the adjustable capacitor 16 is connected between the terminal 51B coupled to the other end of the measuring object 2 and the voltage adjusting circuit 15A to store charge according to the inverted signal w2(t). Hence, by adjusting the capacitance $C_V$ of the adjustable capacitor 16, the amount of current flowing through the feedback capacitor 61 can be controlled. Hence, by adjusting the capacitance $C_V$ of the adjustable capacitor 16, the output of the operational amplifier 60 can be prevented from being saturated, even if the capacitance $C_F$ of the feedback capacitor 61 is set smaller to increase detection sensitivity, and also the S/N ratio can be improved. Thus, capacitance change $C_P$ of the measuring object 2 can be detected with high sensitivity.

Further, the voltage amplitude of the probe signal w(t) can be adjusted in the voltage adjusting circuit 15A, and the voltage Vos to be applied to the non-inverting input terminal (+) of the operational amplifier 60 can be adjusted to a desired level in the offset adjusting circuit 15B. Hence, the voltage amplitude of the probe signal w(t) and the voltage Vos can be individually adjusted such that the voltage level of the amplified signal v(t) falls within the output dynamic range of the operational amplifier 60.

Figure 11:
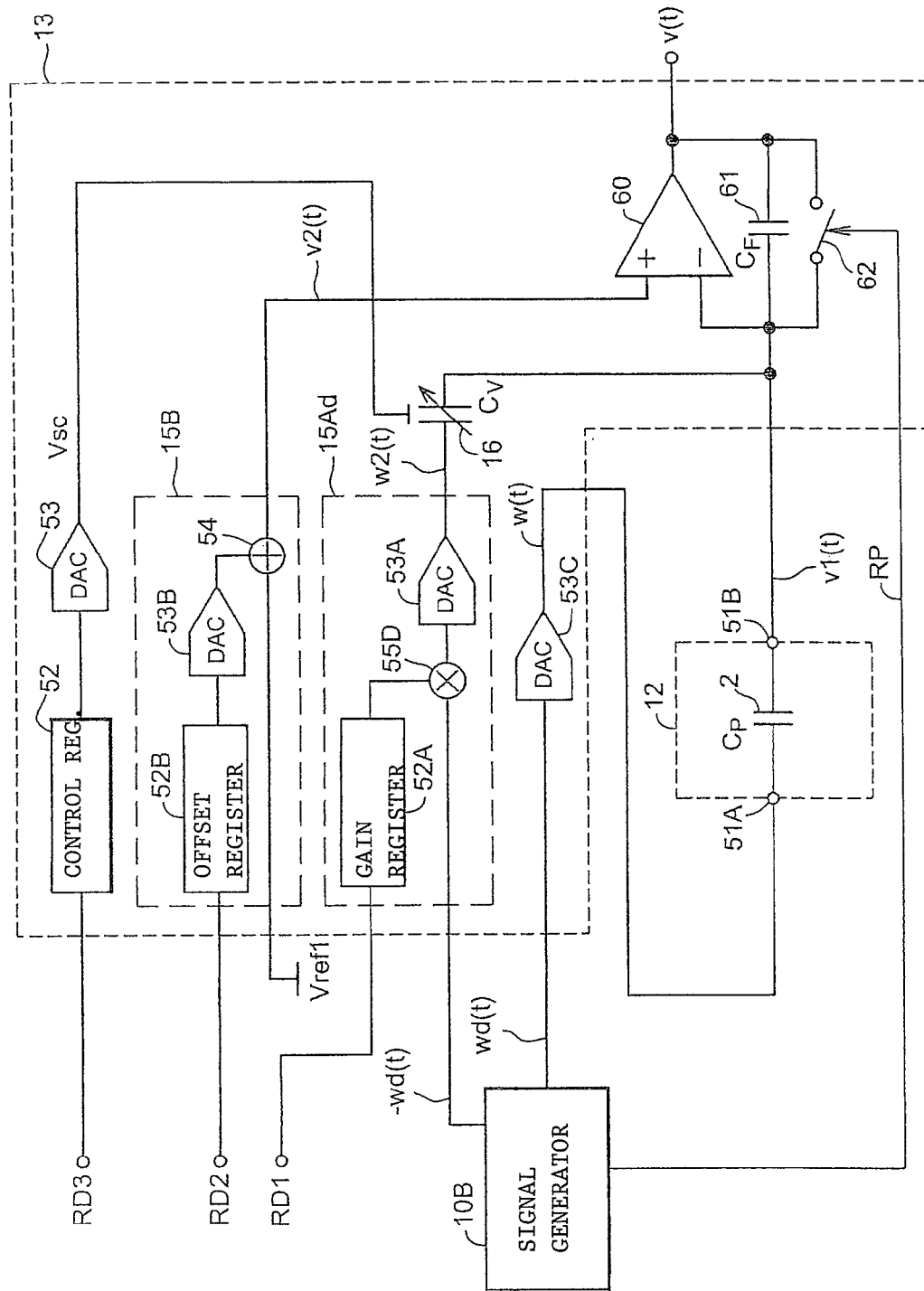
FIG. 11 shows schematically a variant of the differential amplifying circuit of the second embodiment.

FIG. 11 shows schematically a variant of the differential amplifying circuit 13 of the second embodiment. As shown in FIG. 11, the differential amplifying circuit 13 of the present variant has the control register 52, the D/A converter (DAC) 53, the offset adjusting circuit 15B, the adjustable capacitor 16, and the operational amplifier 60. The differential amplifying circuit 13 of the present variant differs in configuration from the differential amplifying circuit 13 of FIG. 10 in that it has a D/A converter (DAC) 53C and a voltage adjusting circuit 15Ad. A signal generator 10B shown in FIG. 11 supplies a digital probe signal wd(t) and an inverted signal −wd(t) opposite in phase to the digital probe signal wd(t) to the differential amplifying circuit 13. In the present variant, the signal generator 10B corresponds to the "first signal generator to generate a probe signal" and the "second signal generator to generate an inverted signal" of the present invention.

In the differential amplifying circuit 13 of the present variant, the D/A converter 53C performs D/A-conversion of the digital probe signal wd(t) from the signal generator 10B and supplies the converted signal as the probe signal w(t) to the sensor unit 12.

The voltage adjusting circuit 15Ad comprises a gain register 52A, a digital multiplier 55D and a D/A converter (DAC) 53A. The gain register 52A holds the value of the control signal RD1 from the controller 14 (FIG. 1). The digital multiplier 55D multiplies the inverted signal −wd(t) from the signal generator 10B by the output of the gain register 52A. The D/A converter 53A performs D/A-conversion of the output of the digital multiplier 55D and gives the converted signal as an adjusted signal W2($t$) to the adjustable capacitor 16. Thus, the gain register 52A, the digital multiplier 55D, and the D/A converter 53A form a digital amplifying circuit (amplitude adjusting circuit). By adjusting the value held in the gain register 52A of the voltage adjusting circuit 15Ad, the gain of the digital amplifying circuit can be set variably.

Figure 12:
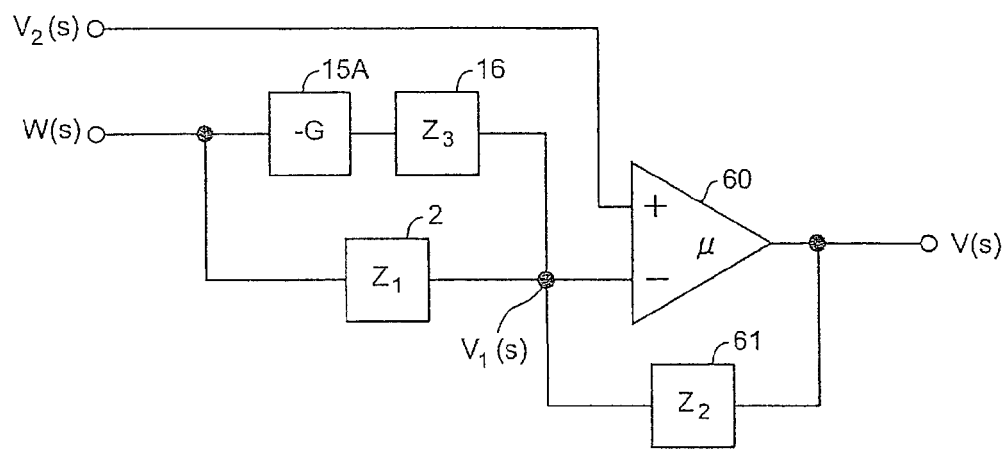
FIG. 12 is a block diagram showing schematically a part of the configuration of the capacitance detecting apparatus according to the second embodiment.

The theoretical background will be described below. FIG. 12 is a block diagram showing a system comprising the voltage adjusting circuit 15A, the adjustable capacitor 16, the measuring object 2, the operational amplifier 60, and the feedback capacitor 61. In FIG. 12, let $W(s)$, $V_1(s)$, $V_2(s)$, and $V(s)$ be Laplace transforms for the functions of time t, i.e., w(t), v1($t$), v2($t$), and v(t) shown in FIG. 8 respectively, where s is the variable (Laplace operator) of the Laplace transforms. Further, let $Z_1(s)$ be the transfer characteristic (impedance) of the measuring object 2, $\mu$ be the open loop gain of the operational amplifier 60, $Z_2(s)$ be the transfer characteristic (impedance) of the feedback capacitor 61, and $Z_3(s)$ be the transfer characteristic (impedance) of the adjustable capacitor 16. For convenience of description, the transfer characteristic −G of the voltage adjusting circuit 15A indicates only the inverting gain, and the voltage of the adjusted signal v2($t$) input to the non-inverting input terminal (+) is at zero (i.e., $V_2(s)=0$).

When the input impedance of the operational amplifier 60 is substantially infinite and also the open loop gain $\mu$ of the operational amplifier 60 is substantially infinite, a transfer function $V(s)/W(s)$ is given as the following equation (10):

$$V(s)/W(s) = -Z_2(s)/Z_1(s) + G \times Z_2(s)/Z_3(s). \quad (10)$$

Since the capacitance of the measuring object 2 is denoted as $C_P$, the transfer characteristic of the measuring object 2 is expressed as $Z_1(s)=1/(C_P \times s)$. Also since the capacitance of the feedback capacitor 61 is denoted as $C_F$, the transfer characteristic of the feedback capacitor 61 is expressed as $Z_2(s) =1/(C_F \times s)$, and since the capacitance of the adjustable capacitor 16 is denoted as $C_V$, the transfer characteristic of the adjustable capacitor 16 is expressed as $Z_3(s)=1/(C_V \times s)$, Thus the equation (10) can be rewritten as the following equation (10a):

$$\frac{V(s)}{W(s)} = \frac{1}{C_F} \times (G \times C_V - C_P). \quad (10a)$$

Desirably the inverting gain −G of the voltage adjusting circuit 15A is adjusted such that the amplitude of the amplified signal v(t) becomes substantially zero in an initial state before the capacitance change is detected. This is for preventing the voltage level of the amplified signal v(t) from reaching the saturated level as much as possible when the capacitance $C_P$ of the measuring object 2 changes from the capacitance $C_P(0)$ at the initial state.

If the amplitude of the amplified signal v(t) is always at zero, the left side of the equation (10) becomes zero. Here, the equation (10a) is rewritten as the following equation (11):

$$G = C_P(0)/C_V. \quad (11)$$

Thus, if the capacitance $C_P(0)$ at the initial state is known, the gain of the voltage adjusting circuit 15A can be adjusted such that the amplitude of the amplified signal v(t) becomes substantially zero. That is, the controller 14 of FIG. 1 can change the gain of the voltage adjusting circuit (digital amplifying circuit) 15A stepwise by changing stepwise the value of the control signal RD1 that is given to the gain register 52A of FIG. 10. The controller 14 determines at each step whether the amplitude of the amplified signal v(t) measured in the computing unit 23 of FIG. 1 is substantially at zero, or the controller 14 may search for the step where the amplitude of the amplified signal v(t) is closest to zero. Then, the controller 14 can determine the inverting gain −G at the step where the amplitude of the amplified signal v(t) is substantially at zero or the inverting gain −G at the step where the amplitude of the amplified signal v(t) is closest to zero.

Substituting the gain G of the equation (11) into the equation (10a) and rewriting the equation (10a), the transfer function $V(s)/W(s)$ is given by the following equation (12):

$$V(s)/W(s) = -\Delta C_P/C_F. \quad (12)$$

Here $\Delta C_P = C_P - C_P(0)$, and the $\Delta C_P$ represents the amount of capacitance change of the measuring object 2.

If the capacitance $C_F$ of the feedback capacitor 61 is set to be k times the capacitance $C_P(0)$ of the measuring object 2, where k is a real number, i.e., if the equation $C_F = k \times C_P(0)$ is satisfied, the equation (12) can be rewritten as the following equation (13):

$$\frac{V(s)}{W(s)} = \frac{-1}{k} \times \frac{\Delta C_P}{C_P(0)}. \quad (13)$$

Thus, the transfer function $V(s)/W(s)$ for when the coefficient k is 1.0 and 0.1 is given by the following equations (13a), (13b) respectively:

$$\frac{V(s)}{W(s)} = \begin{cases} -\Delta C_P/C_P(0) & \text{for } k = 1.0 \quad (13a) \\ -10 \times \Delta C_P/C_P(0) & \text{for } k = 0.1 \quad (13b) \end{cases}$$

As illustrated in the equations (13a), (13b), it is found that as the capacitance $C_F$ of the feedback capacitor 61 becomes smaller, the sensitivity in detecting capacitance change of the measuring object 2 increases. Further, when the coefficient k is 0.1, the second embodiment can detect capacitance change of the measuring object 2 with sensitivity of 10 times as shown in the equation (13b), while the first embodiment can detect capacitance change of the measuring object 2 with sensitivity of 0.9 times as shown in the equation (9b).

Therefore, the differential amplifying circuit 13 of the second embodiment can detect capacitance change with higher sensitivity than that of the first embodiment. But since the differential amplifying circuit 13 of the first embodiment does not need the adjustable capacitor 16 as in the second embodiment and the configuration for generating the inverted signal w2(t), there is the advantage that it can be realized with a simpler configuration as compared with the second embodiment.

Third Embodiment

Figure 13:
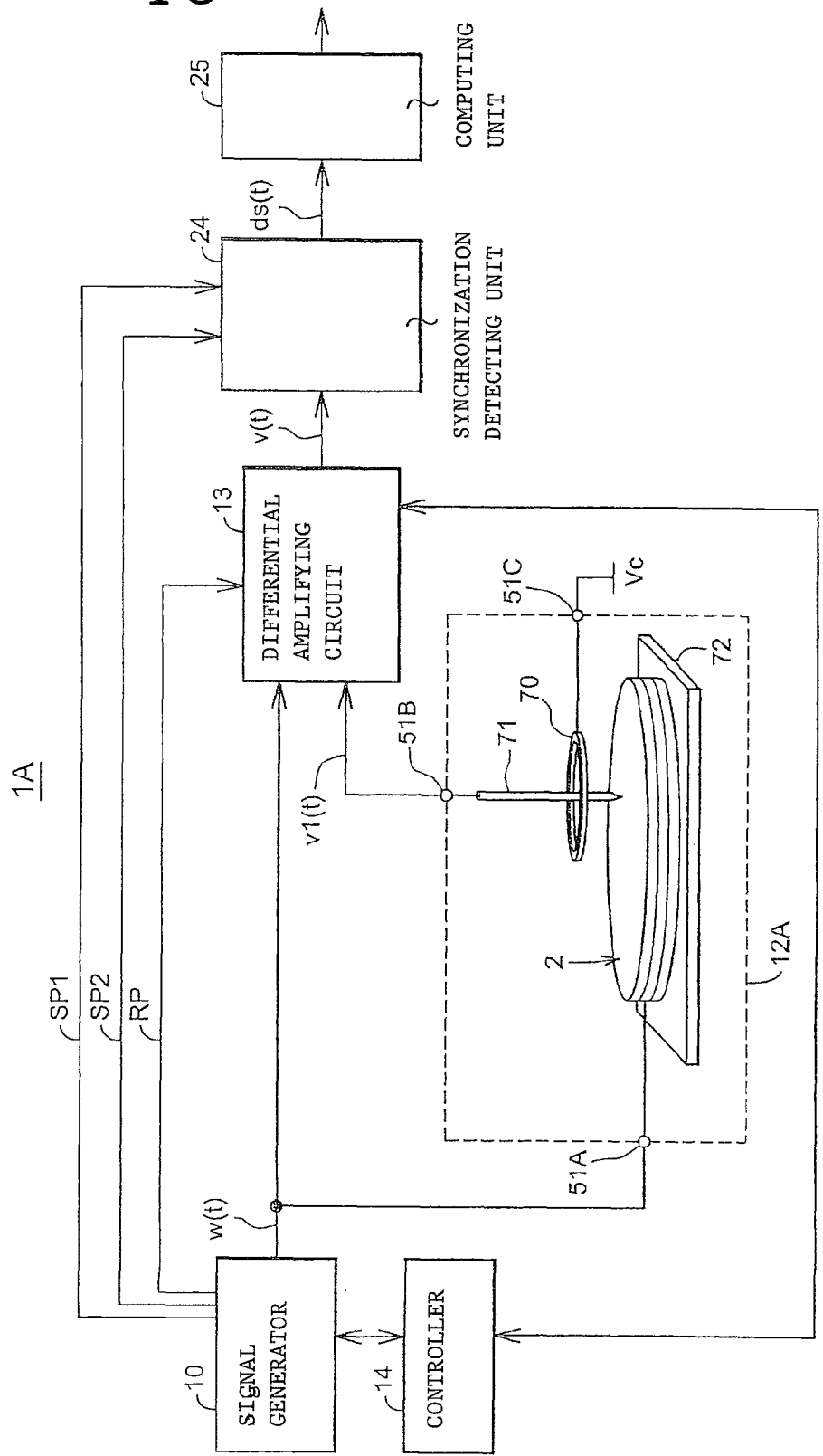
FIG. 13 is a block diagram showing schematically the configuration of the capacitance detecting apparatus according to a third embodiment of the present invention.

Next, a third embodiment of the present invention will be described. FIG. 13 is a block diagram showing schematically the configuration of a capacitance detecting apparatus 1A according to the third embodiment. The capacitance detecting apparatus 1A has a signal generator 10, a differential amplifying circuit 13, and a controller 14, and these components 10, 13, 14 have substantially the same functions as the components 10, 13, 14 respectively of the capacitance detecting apparatus 1 of the above embodiments. The capacitance detecting apparatus 1A further has a sensor unit 12A, a synchronization detecting unit 24, and a computing unit 25. The capacitance detecting apparatus 1A detects capacitance change of a ferroelectric medium 2 as a measuring object placed in the sensor unit 12A and reproduces bit information recorded in the ferroelectric medium 2 based on the detection results.

The signal generator 10 of the capacitance detecting apparatus 1A may be configured as shown in FIG. 2, and the differential amplifying circuit 13 may be configured as shown in FIG. 3, 4, 8, or 10. Alternatively, the capacitance detecting apparatus 1A may be configured with the signal generator 10B and the differential amplifying circuit 13 shown in FIG. 5 or 11.

As shown in FIG. 13, the sensor unit 12A has a moving stage 72 on which the disk-like ferroelectric medium 2 is mounted. The moving stage 72 can drive the ferroelectric medium 2 by means of an actuator (not shown) in two-axis or three-axis directions. The sensor unit 12A has a needle-like probe 71 that is placed such that its tip faces the surface of the ferroelectric medium 2 and an annular probe 70 placed around the probe 71.

The annular probe 70 is apart from the surface of the ferroelectric medium 2 and placed such that its center axis substantially coincides with the axis of the probe 71. The tip of the probe 71 has a radius of several nm to several tens nm and is placed in contact with, or adjacent to, the surface of the ferroelectric medium 2. The probe 71 can be made by coating semiconductor material such as silicon with a protection film of platinum indium, for example.

Figure 14:
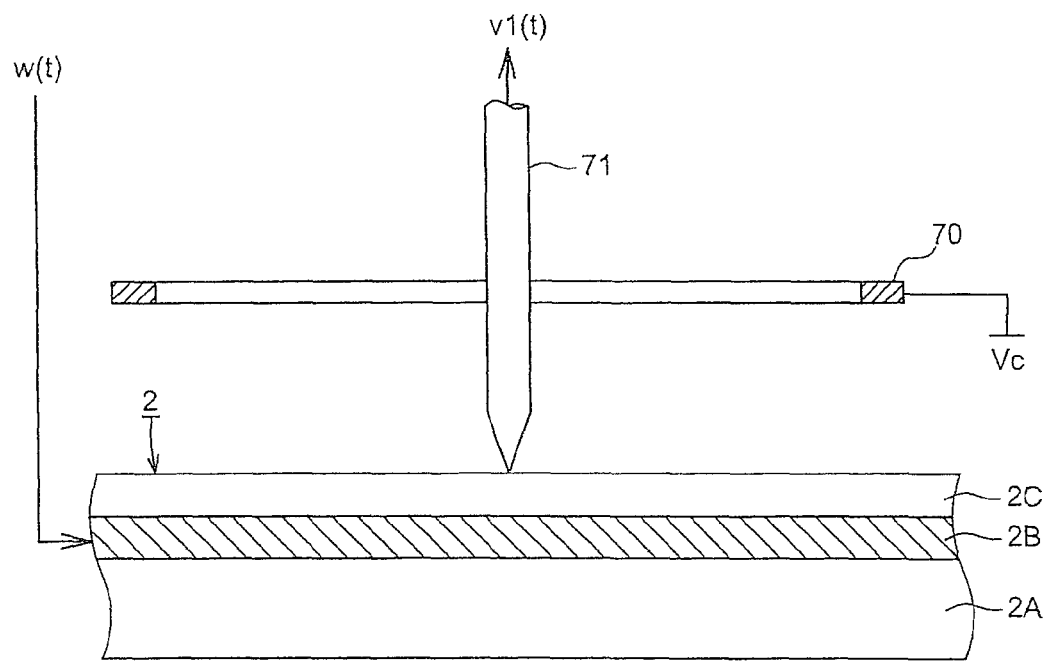
FIG. 14 shows schematically a sectional view of a ferroelectric medium.
Figure 14:
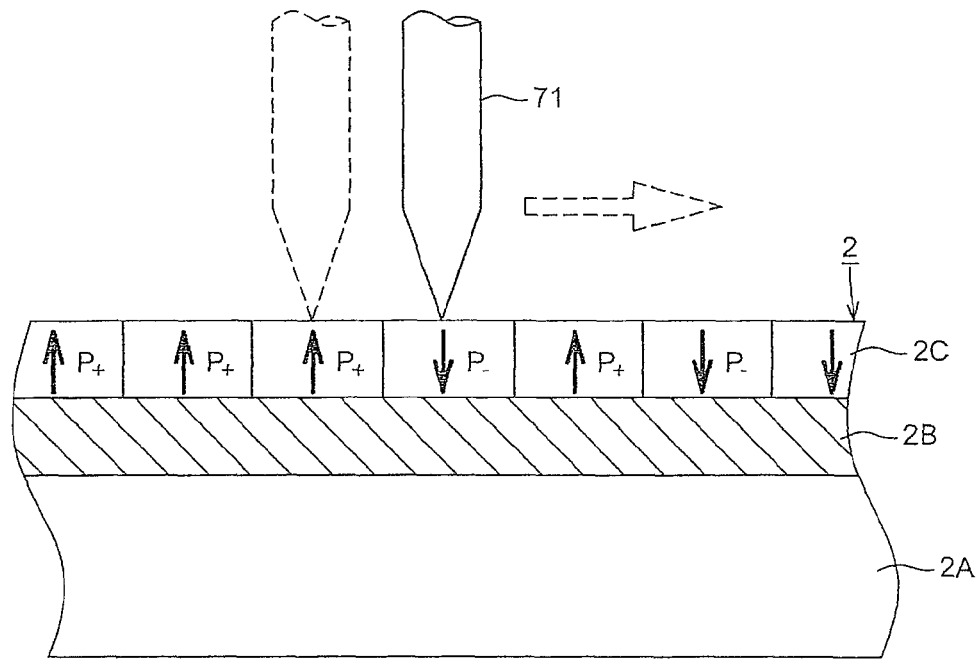

As shown in the sectional view of FIG. 14(A), the ferroelectric medium 2 has a back substrate 2A, an electrode layer 2B formed on the back substrate 2A, and a record layer 2C formed on the electrode layer 2B. The electrode layer 2B is made of conductive material such as chromium. The record layer 2C has a thickness of several tens nm to several hundred nm and is a ferroelectric layer of a perovskite crystal structure that has a hysteresis characteristic inducing spontaneous polarization, the layer including a single crystal layer of, e.g., $LiTaO_3$. As shown in FIG. 14(B), spontaneous polarization of either a polarization vector $P_+$ of a plus vertical direction or a polarization vector $P_-$ of a minus vertical direction (an opposite direction) can be recorded as bit information in each micro domain of the record layer 2C.

As shown in FIG. 13, the probe signal w(t) from the signal generator 10 is given to the electrode layer 2B of the ferroelectric medium 2 via the connection terminal 51A. The response signal v1(t) corresponding to this probe signal w(t) occurs on the probe 71, and this response signal v1(t) is given to the differential amplifying circuit 13 via the output terminal 51B. A constant reference potential Vc is applied to the annular probe 70 via a connection terminal 51C. The reference potential Vc may be, e.g., ground potential.

Figure 15:
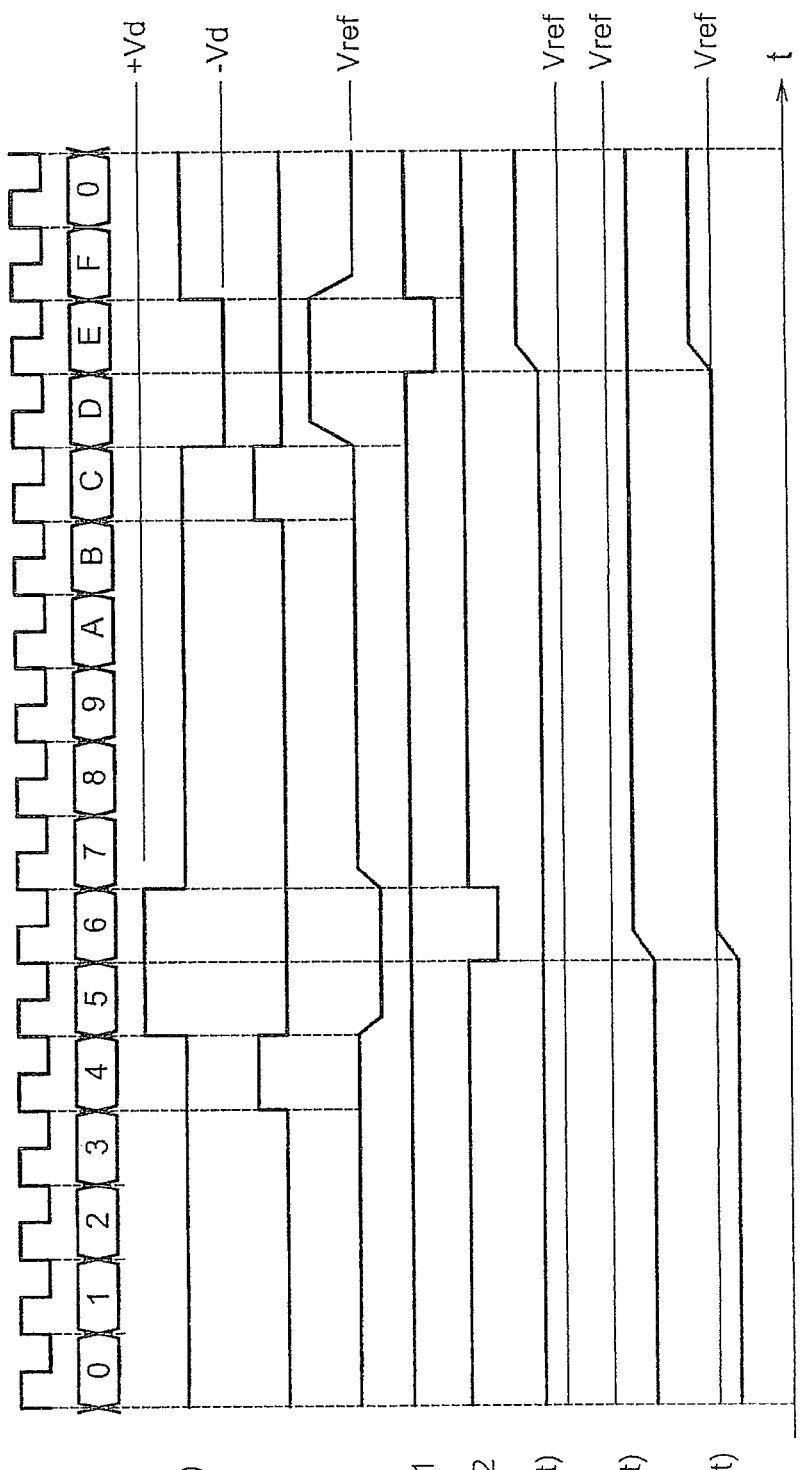
FIG. 15 is a timing chart for explaining the operation of the capacitance detecting apparatus according to the third embodiment.

An example operation of the capacitance detecting apparatus 1A will be described below with reference to the timing charts of FIG. 15, (A) to (J). In this example, the oscillator 30 of FIG. 2 generates a reference clock CLK shown in FIG. 15(A), and the counter 31 of FIG. 2 counts pulses of the reference clock CLK to generate a four-bit binary value. FIG. 15(B) shows the count held in the counter 31.

As shown in FIG. 15(C), the analog switch 32 of FIG. 2 generates combinations of a positive polarity pulse of the positive polarity voltage +Vd and a negative polarity pulse of the negative polarity voltage −Vd as the probe signal w(t). The combination of a positive polarity pulse and a negative polarity pulse may be generated at least once. In FIG. 15(C), a positive polarity pulse is generated during the time that the count is "5", "6", and a negative polarity pulse is generated during the time that the count is "D", "E". This probe signal w(t) is supplied to the differential amplifying circuit 13 and the sensor unit 12A.

As shown in FIG. 15(D), the decoder 33 of FIG. 2 generates a reset pulse RP of a high level immediately before each of the positive and negative polarity pulses of the probe signal w(t) is generated. This reset pulse RP turns on the reset switch 62 of the differential amplifying circuit 13 of the first embodiment shown in FIG. 3, 4, or 5 (or the differential amplifying circuit 13 of the second embodiment shown in FIG. 8, 10, or 11) to discharge the charge stored in the feedback capacitor 61. Thereby, the voltage level of the output v(t) of the operational amplifier 60 is held at the reference potential Vref as shown in FIG. 15(E).

After the reset pulse RP is generated, during the time that a positive polarity pulse of the probe signal w(t) is applied to the electrode layer 2B of the ferroelectric medium 2, the voltage level of the output v(t) of the operational amplifier 60 falls from the reference potential Vref and reaches a negative peak level as shown in FIG. 15(E). In contrast, during the time that a negative polarity pulse of the probe signal w(t) is applied to the electrode layer 2B of the ferroelectric medium 2, the voltage level of the output v(t) rises from the reference potential Vref and reaches a positive peak level as shown in FIG. 15(E).

Meanwhile, the synchronization detecting unit 24 of FIG. 13 samples a negative peak level of the amplified signal v(t) at the falling edge of the sampling pulse SP2 shown in FIG. 15(G) and holds this. As a result, a bottom signal bs(t) having the negative peak level of the amplified signal v(t) is generated as shown in FIG. 15(I). Further, the synchronization detecting unit 24 samples a positive peak level of the amplified signal v(t) at the falling edge of the sampling pulse SP1 shown in FIG. 15(F) and holds this. As a result, a peak signal ps(t) having the positive peak level of the amplified signal v(t) is generated as shown in FIG. 15(H). Then the synchronization detecting unit 24 adds the bottom signal bs(t) and the peak signal ps(t) to generate a detected signal ds(t) having a waveform as shown in FIG. 15(J).

The computing unit 25 of FIG. 13 can compare the voltage level of the detected signal ds(t) with a predetermined threshold level and reproduce a high level signal of a logic value "1" corresponding to the polarization vector $P_+$ if the voltage level exceeds the threshold level and reproduce a low level signal of a logic value "0" corresponding to the polarization vector $P_-$ if the voltage level is lower than or equal to the threshold level.

The ferroelectric medium 2 has a different capacitance depending on the polarity of the electric field applied between the probe 71 and the electrode layer 2B. Let Cpp be the capacitance of the ferroelectric medium 2 during the time period Tp that the probe signal w(t) has an amplitude of +Vd (the time that the count is "5", "6") and Cpn be the capacitance of the ferroelectric medium 2 during the time period Tn that the probe signal w(t) has an amplitude of −Vd (the time that the count is "D", "E"). Then the amplitude of the amplified signal v(t) corresponding to the capacitance Cpp of the ferroelectric medium 2 during the time period Tp is indicated by the bottom signal bs(t), and the amplitude of the amplified signal v(t) corresponding to the capacitance Cpn of the ferroelectric medium 2 during the time period Tn is indicated by the peak signal ps(t). The detected signal ds(t) indicating the difference between the absolutes values of these signals ps(t), bs(t) is a signal corresponding to the difference between the capacitances Cpn, Cpp. Thus, by determining the voltage polarity of the detected signal ds(t), a magnitude relationship between the capacitances Cpn, Cpp can be determined, and the orientation of spontaneous polarization can be determined according to the magnitude relationship.

As described above, in the capacitance detecting apparatus 1A of the third embodiment, the voltage level of the amplified signal v(t) can be limited to within an appropriate range without reaching the saturated level even if the capacitance $C_F$ of the feedback capacitor 61 is set small to detect changes in the minute capacitance $C_P$ of the ferroelectric medium 2. Therefore, the polarization states of the ferroelectric medium 2 can be detected with high sensitivity.

Further, the capacitance detecting apparatus 1A has the advantage that it can operate at a band lower than a high frequency band of the order of GHz and hence is not likely to be affected by external noise or static electricity. In particular, even where a plurality of the capacitance detecting apparatuses 1A placed adjacent to each other operate simultaneously in parallel, the occurrence of crosstalk between these capacitance detecting apparatuses 1A can be prevented.

Moreover, although the reproducing apparatus disclosed in the patent documents 2 (Japanese Patent Kokai No. 2004-127489) or Patent document 3 (European Patent Application Publication No. 1398779) previously mentioned requires an oscillator and an FM demodulator, the capacitance detecting apparatus 1A of the third embodiment can detect the polarization states of the ferroelectric medium 2 without need for the oscillator and FM demodulator and hence is suitable for circuit integration.

The invention claimed is:

1. A capacitance detecting apparatus which gives a detected signal indicating a change in capacitance of a measuring object, comprising:
    a signal generator to generate a probe signal of a predetermined frequency and supply said probe signal to one end of said measuring object;
    a differential amplifying circuit to amplify differentially a response signal obtained from the other end of said measuring object and said probe signal;
    a detecting unit to produce said detected signal based on the amplified signal from said differential amplifying circuit;
    a computing unit to reproduce information recorded in a ferroelectric medium that constitutes said measuring object based on the change in said capacitance detected by said detecting unit;
    a sensor unit to read out said response signal from said ferroelectric medium;
    wherein said ferroelectric medium comprises:
        an electrode layer made of conductive material; and
        a record layer made of a ferroelectric and placed on said electrode layer,
    wherein said sensor unit comprises:
        a probe placed such that its tip faces a surface of said record layer;
        an annular probe placed around said probe and apart from the surface of said record layer;
        a connection terminal to give said probe signal to said electrode layer through; and
        an output terminal to output a signal developed on said probe corresponding to said probe signal as said response signal; and
        a connection terminal to apply a constant reference potential to said annular probe through;
    wherein said differential amplifying circuit has an inverting input terminal to which said response signal is inputted and a non-inverting input terminal to which said probe signal is inputted.

2. A capacitance detecting apparatus according to claim 1, wherein said differential amplifying circuit comprises an operational amplifier having an inverting input terminal to which said response signal is input, a non-inverting input terminal to which said probe signal is input, an output terminal to output said amplified signal through, and a feedback capacitor connected between said output terminal and said inverting input terminal.

3. A capacitance detecting apparatus according to claim 2, wherein said differential amplifying circuit comprises an amplitude adjusting circuit interposed between said signal generator and the non-inverting input terminal of said operational amplifier to adjust the voltage amplitude of said probe signal.

4. A capacitance detecting apparatus according to claim 3, wherein said amplitude adjusting circuit comprises a variable gain amplifier to amplify said voltage amplitude, and the gain of said variable gain amplifier is set variably according to an external control signal.

5. A capacitance detecting apparatus according to claim 2, further comprising:
    an offset adjusting circuit interposed between said signal generator and the non-inverting input terminal of said operational amplifier to adjust an offset of said probe signal.

6. A capacitance detecting apparatus according to claim 5, wherein the amount of the offset adjustment of said probe signal is set variably according to an external control signal.

7. A capacitance detecting apparatus according to claim 1, wherein said signal generator generates a combined signal of a first pulse of either positive or negative voltage polarity and a second pulse of voltage polarity opposite to that of said first pulse one or more times as said probe signal.

8. A capacitance detecting apparatus according to claim 7, wherein said operational amplifier has a reset switch connected in parallel with said feedback capacitor, and said signal generator gives said reset switch a reset pulse to turn on said reset switch to be conductive immediately before generating each of said first and second pulses.

9. A capacitance detecting apparatus according to claim 1, wherein said detecting unit comprises a first sample-hold circuit that samples and holds a positive peak level of said amplified signal, a second sample-hold circuit that samples and holds a negative peak level of said amplified signal, and a signal calculating unit that calculates the change in said capacitance based on the sampled positive peak level and the sampled negative peak level.

10. A capacitance detecting apparatus according to claim 9, wherein said signal calculating unit comprises an adder/subtractor that adds said sampled positive peak level and said sampled negative peak level or subtracts one from the other of said sampled positive peak level and said sampled negative peak level.

11. A capacitance detecting apparatus according to claim 1, further comprising:
   a computing unit to measure pressure applied to said measuring object based on the change in said capacitance detected by said detecting unit.

12. A capacitance detecting apparatus according to claim 1, further comprising:
   a computing unit to measure acceleration of said measuring object based on the change in said capacitance detected by said detecting unit.

13. A capacitance detecting apparatus according to claim 1, further comprising:
   a computing unit to measure displacement of said measuring object based on the change in said capacitance detected by said detecting unit.

14. A capacitance detecting apparatus according to claim 1, wherein said signal generator, said differential amplifying circuit, and said detecting unit are incorporated in an integrated circuit.

15. A capacitance detecting apparatus which gives a detected signal indicating a change in capacitance of a measurement subject, comprising:
   a first signal generator to generate a probe signal of a predetermined frequency and supply said probe signal to one end of said measurement subject;
   a differential amplifying circuit to amplify differentially a response signal obtained from the other end of said measurement subject and a reference signal;
   a second signal generator to generate an inverted signal opposite in phase to said probe signal;
   an amplitude adjusting circuit to adjust the voltage amplitude of said inverted signal;
   an adjustable capacitor connected between the other end of said measurement subject and said second signal generator to store charge according to said inverted signal; and
   a detecting trait to produce said detected signal based on the amplified signal from said differential amplifying circuit,
   wherein said differential amplifying circuit has an inverting input terminal to which said response signal is inputted,
   wherein said differential amplifying circuit comprises an operational amplifier having said inverting input terminal to which said response signal is input, a non-inverting input terminal, an output terminal to output said amplified signal through, and a feedback capacitor connected between said output terminal and said inverting input terminal, and
   wherein the adjustable capacitor is adjustable to vary an amount of current through the feedback capacitor to prevent saturation of the differential amplifier circuit.

16. A capacitance detecting apparatus according to claim 15, wherein said amplitude adjusting circuit comprises a variable gain amplifier to amplify said voltage amplitude, and the gain of said variable gain amplifier is set variably according to an external control signal.

17. A capacitance detecting apparatus according to claim 15, further comprising:
   an offset adjusting circuit to adjust an offset of said reference signal.

18. A capacitance detecting apparatus according to claim 17, wherein the amount of the offset adjustment of said reference signal is set variably according to an external control signal.

19. A capacitance detecting apparatus according to claim 15, wherein said adjustable capacitor is a variable capacitor having capacitance varying according to an external control signal.

20. A capacitance detecting apparatus according to claim 19, wherein said variable capacitor comprises first and second variable capacitance diodes serially connected, where the cathode of said first variable capacitance diode and the cathode of said second variable capacitance diode are connected to each other, and the capacitance of said variable capacitor varies according to the voltage of said control signal applied to said cathodes.

* * * * *